United States Patent
Yang et al.

(10) Patent No.: US 10,423,259 B2
(45) Date of Patent: Sep. 24, 2019

(54) DISPLAY APPARATUS INCLUDING CONDUCTIVE LAYER HAVING FLEXIBILITY

(71) Applicant: Samsung Display Co., Ltd., Yongin-si (KR)

(72) Inventors: Chanwoo Yang, Siheung-si (KR); Hansu Kim, Seoul (KR); Hyuneok Shin, Gwacheon-si (KR); Dongmin Lee, Anyang-si (KR); Juhyun Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 106 days.

(21) Appl. No.: 15/683,417

(22) Filed: Aug. 22, 2017

(65) Prior Publication Data
US 2018/0088713 A1 Mar. 29, 2018

(30) Foreign Application Priority Data

Sep. 23, 2016 (KR) .................. 10-2016-0122451

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/044* (2013.01); *H01L 27/323* (2013.01);
(Continued)

(58) Field of Classification Search
CPC .............. H01L 51/0097; G06F 3/0412; G06F 2203/04102; G06F 2203/04103
See application file for complete search history.

(56) References Cited

U.S. PATENT DOCUMENTS

2004/0188150 A1* 9/2004 Richard .................. G06F 3/041
178/18.01
2011/0175065 A1 7/2011 De La Vega et al.
(Continued)

FOREIGN PATENT DOCUMENTS

KR 10-1234881 2/2013
KR 10-2014-0129805 11/2014
(Continued)

OTHER PUBLICATIONS

Chuan Fei Guo et al., "Highly stretchable and transparent nanomesh electrodes made by grain boundary lithography," Nature Communications, Jan. 28, 2014, pp. 1-8, Macmillan Publishers Limited, Houston, TX, USA.
(Continued)

*Primary Examiner* — Laurence J Lee
(74) *Attorney, Agent, or Firm* — H.C. Park & Associates, PLC

(57) ABSTRACT

A display apparatus includes a display panel and a sensor structure disposed on the display panel. The sensor structure includes a sensing electrode and a connection line connected to the sensing electrode. At least one of the sensing electrode and the connection line includes a conductive pattern layer. The conductive patter layer includes a base part, protrusions randomly disposed on the base part and protruding from the base part, and holes randomly defined in the base part.

20 Claims, 15 Drawing Sheets

(51) Int. Cl.
  *H01L 51/00*   (2006.01)
  *G06F 3/044*   (2006.01)

(52) U.S. Cl.
  CPC ...... *H01L 27/3276* (2013.01); *H01L 51/0097* (2013.01); *G06F 2203/04102* (2013.01); *G06F 2203/04103* (2013.01); *H01L 2251/5338* (2013.01)

(56) References Cited

U.S. PATENT DOCUMENTS

| | | | | |
|---|---|---|---|---|
| 2012/0075215 | A1* | 3/2012 | Yeh | G06F 3/044 345/173 |
| 2014/0320448 | A1* | 10/2014 | Kim | G06F 3/044 345/174 |
| 2014/0377579 | A1 | 12/2014 | Ren et al. | |
| 2015/0188080 | A1* | 7/2015 | Choi | H01L 51/56 257/88 |
| 2015/0357424 | A1* | 12/2015 | Kitao | H01L 29/41741 257/334 |

FOREIGN PATENT DOCUMENTS

| | | |
|---|---|---|
| KR | 10-1477291 | 12/2014 |
| KR | 10-2015-0105798 | 9/2015 |

OTHER PUBLICATIONS

Chan Il Yeo et al., "Wafer-scale broadband antireflective silicon fabricated by metal-assisted chemical etching using spin-coating Ag ink," Optics Express, Aug. 2, 2011, pp. A1109-A1116, vol. 19, No. S5, OSA Publishing, USA.

* cited by examiner

DISPLAY APPARATUS INCLUDING CONDUCTIVE LAYER HAVING FLEXIBILITY

CROSS-REFERENCE TO RELATED APPLICATION

This application claims priority from and the benefit of Korean Patent Application No. 10-2016-0122451, filed Sep. 23, 2016, which is hereby incorporated by reference for all purposes as if fully set forth herein.

BACKGROUND

Field

Exemplary embodiments relate to a display apparatus. More particularly, exemplary embodiments relate to a display apparatus including a conductive pattern layer having flexibility.

Discussion

Various display apparatuses used in multimedia devices, such as televisions, mobile phones, tablet computers, navigation devices, game consoles, and the like, are being developed. Such a display apparatus typically includes a keyboard or a mouse as an input unit or mechanism. Also, the display apparatus can include a sensing unit (or structure), such as a touch sensing unit, as the input unit.

The above information disclosed in this section is only for enhancement of an understanding of the background of the inventive concepts, and, therefore, it may contain information that does not form prior art already known to a person of ordinary skill in the art.

SUMMARY

One or more exemplary embodiments provide a display apparatus including a conductive pattern layer having flexibility.

One or more exemplary embodiments provide a method of manufacturing a display apparatus including a conductive pattern layer having flexibility.

Additional aspects will be set forth in the detailed description which follows, and, in part, will be apparent from the disclosure, or may be learned by practice of the inventive concept.

According to one or more exemplary embodiments, a display apparatus includes a display panel and a sensor structure disposed on the display panel. The sensor structure includes a sensing electrode and a connection line connected to the sensing electrode. At least one of the sensing electrode and the connection line includes a conductive pattern layer. The conductive patter layer includes a base part, protrusions randomly disposed on the base part and protruding from the base part, and holes randomly defined in the base part According to one or more exemplary embodiments, a method of manufacturing a display apparatus includes: forming a base layer including an electrically conductive material on a structure of the display apparatus; and exposing the base layer to thermal treatment to enable self-assembly of an electrically conductive pattern layer on the structure. The electrically conductive pattern layer includes a base part, protrusions protruding from a surface of the base part, and holes in the surface of the base part. The electrically conductive pattern layer is disposed in a flexible portion of the display apparatus.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
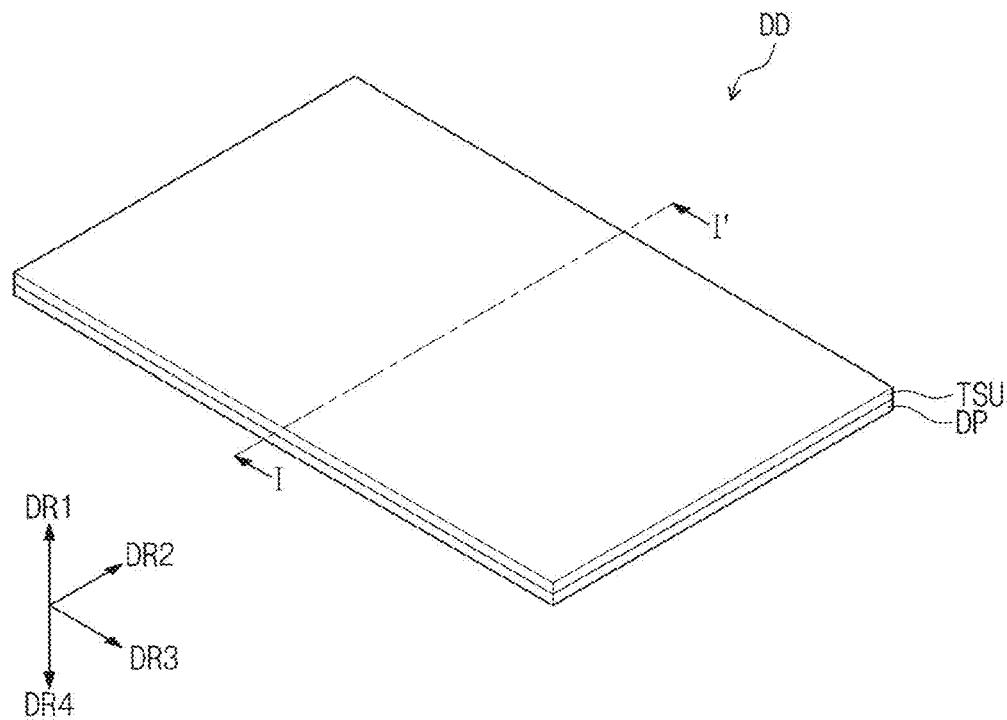
FIG. 1 is a perspective view of a display apparatus according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the various illustrated axes are not limited to axes of a rectangular coordinate system, and may be interpreted in a broader sense. For example, some of the axes may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
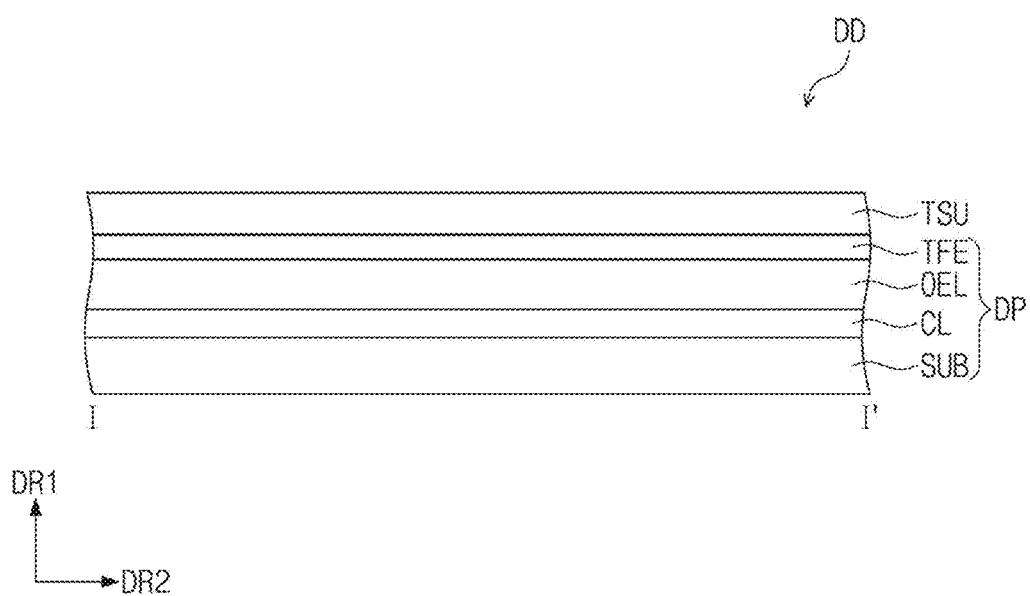
FIG. 2 is a cross-sectional view of the display apparatus of FIG. 1 taken along sectional line I-I' according to one or more exemplary embodiments.

FIG. 1 is a perspective view of a display apparatus according to one or more exemplary embodiments. FIG. 2 is a cross-sectional view of the display apparatus of FIG. 1 taken along sectional line I-I' according to one or more exemplary embodiments.

Referring to FIGS. 1 and 2, the display apparatus DD may include a display panel DP and a sensor unit (or structure) TSU. The sensor unit TSU may be disposed on the display panel DP. The display panel DP provides an image, and the sensor unit TSU may recognize a user's direct touch, a user's indirect touch, an object's direct touch, or an object's indirect touch.

The sensor unit TSU may sense at least one of a position or intensity (e.g., a pressure) of a touch applied from the outside. The sensor unit TSU according to one or more exemplary embodiments may have various structures and/or be made of various materials, but exemplary embodiments are not limited thereto or thereby. For example, the sensor unit TSU may be a touch sensing unit that senses touch.

Hereinafter, although the display panel DP will be described as an organic light emitting display panel, exemplary embodiments are not limited thereto or thereby. For example, the display panel DP may include a liquid crystal display panel, a plasma display panel, an electrophoretic display panel, a microelectromechanical system (MEMS) display panel, an electrowetting display panel, and/or the like.

Referring to FIG. 2, the display panel DP of the display apparatus DD may include a base substrate SUB, a circuit layer CL disposed on the base substrate SUB, an organic electroluminescent device OEL disposed on the circuit layer CL, and an encapsulation layer TFE disposed on the organic electroluminescent device OEL. The encapsulation layer TFE may protect the organic electroluminescent device OEL. Thus, the encapsulation layer TFE may be disposed to surround the organic electroluminescent device OEL. The encapsulation layer TFE may be constituted by a plurality of layers. The encapsulation layer TFE may include an inorganic layer and an organic layer. The encapsulation layer TFE may include at least two inorganic layers and an organic layer disposed between the at least two inorganic layers. The inorganic layer protects the organic electroluminescent device OEL, and the organic layer protects the organic electroluminescent device OEL against foreign substances, such as dust particles. The inorganic layer may include a silicon nitride layer, a silicon oxynitride layer, and/or a silicon oxide layer. The organic layer may include an acrylic-based organic material, but exemplary embodiments are not limited thereto or thereby. The inorganic layer may be formed through a deposition method, and the organic layer may be formed through a coating process. Exemplary embodiments, however, are not limited thereto or thereby.

The display panel DP may be a flexible display panel, however, exemplary embodiments are not limited thereto or thereby. For example, the display panel DP may be rigid, may include at least one flexible portion and at least one rigid portion, etc.

A sensor unit TSU may be disposed on the display panel DP. The sensor unit TSU may be disposed directly on the display panel DP. Also, an adhesion member (not shown) may be further disposed between the sensor unit TSU and the display panel DP.

Also, the sensor unit TSU may be disposed directly on the encapsulation layer TFE of the display panel DP. For example, the sensor unit TSU may be disposed directly on the encapsulation layer TFE through a continuous process without using a separate adhesion member. However, exemplary embodiments are not limited thereto or thereby. For example, a buffer layer (not shown) may be disposed on the encapsulation layer TFE, and the sensor unit TSU may be disposed on the buffer layer. The buffer layer may be an organic layer or an inorganic layer.

Figure 3:
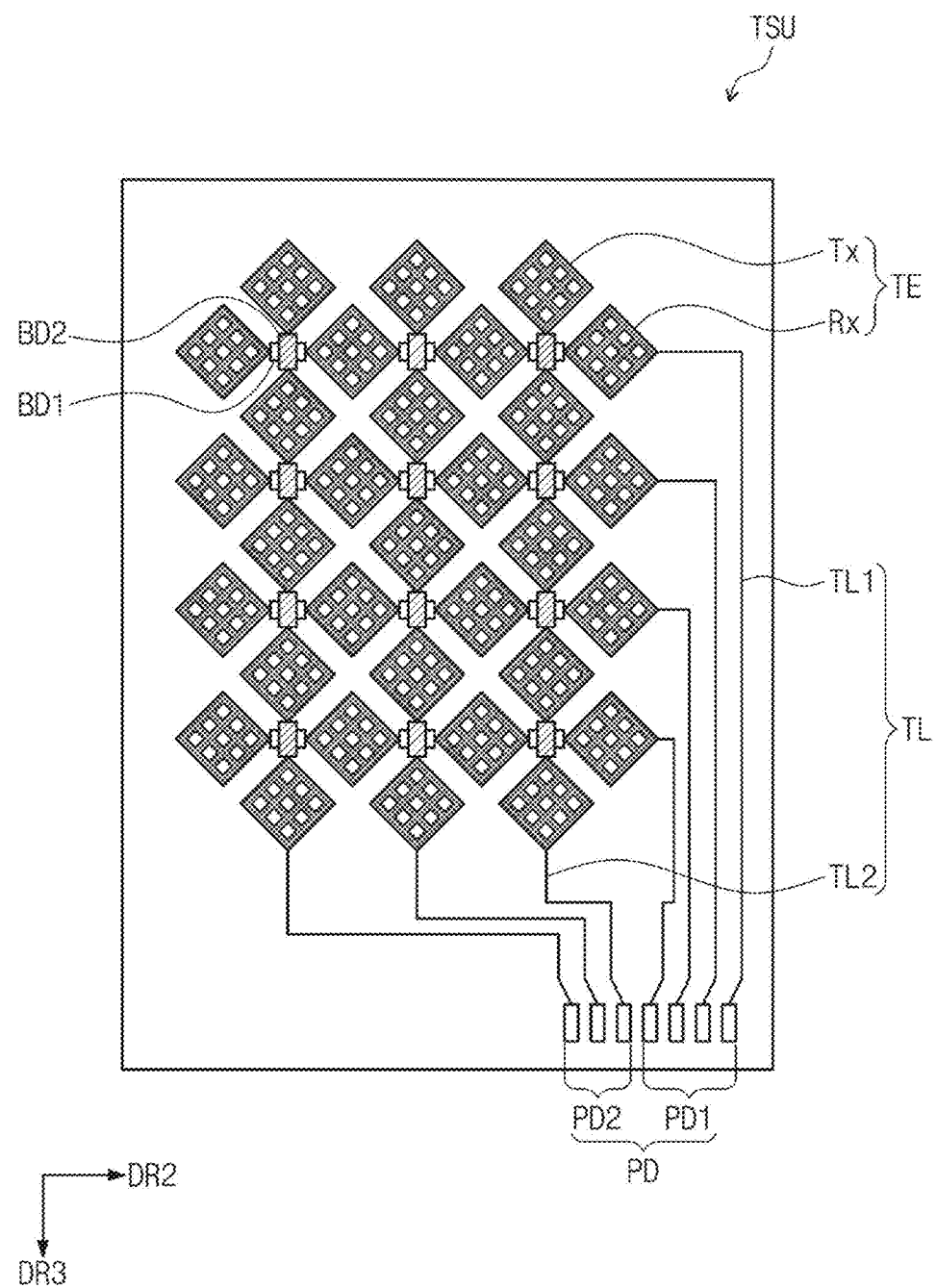
FIG. 3 is a plan view of a sensor unit of the display apparatus of FIG. 1 according to one or more exemplary embodiments.

FIG. 3 is a plan view of a sensor unit of the display apparatus of FIG. 1 according to one or more exemplary embodiments.

The sensor unit TSU may include a sensing electrode TE and a connection line TL. Also, a touch pad part PD including first touch pad PD1 and second touch pad PD2 may be disposed adjacent to one end of the sensor unit TSU. The connection line TL may connect the sensing electrode TE to each of the first touch pad PD1 and the second touch pad PD2. Also, the sensor unit TSU may further include first bridge BD1 and second bridge BD2 connecting the adjacent sensing electrodes TE to each other.

The sensor unit TSU may include a plurality of sensing electrodes TE. The sensing electrodes TE may include a plurality of first sensing electrodes Rx and a plurality of second sensing electrodes Tx. The first sensing electrodes Rx and the second sensing electrodes Tx may be electrically insulated from each other. Each of the first sensing electrodes Rx and the second sensing electrodes Tx may have various shapes, such as a diamond shape, a square shape, a rectangular shape, a circular shape, or an irregular shape (e.g., a shape in which tree branches are interlaced, such as a dendrite structure). Each of the first sensing electrodes Rx and the second sensing electrodes Tx may have a mesh shape.

The first sensing electrodes Rx and the second sensing electrodes Tx may be disposed on (or in) the same layer. Each of the first sensing electrodes Rx and the second sensing electrodes Tx may be disposed on the display panel DP. For example, the sensor unit TSU including the first sensing electrodes Rx and the second sensing electrodes Tx may be disposed directly on the encapsulation layer TFE (see FIG. 2) of the display panel DP. However, exemplary embodiments are not limited thereto or thereby. For example, the sensor unit TSU may be separately provided, coupled to, and, thereby, disposed on the display panel DP using the adhesion member (not shown). In this manner, the sensor unit TSU may include the sensing electrode TE and a substrate (not shown) on which the sensing electrode TE is disposed.

The first sensing electrodes Rx and the second sensing electrodes Tx of the sensor unit TSU may be spaced apart from each other on a plane. As used in this specification, the phrase "on a plane" may mean and refer to features when the display apparatus DD is viewed in a thickness direction (e.g., in a fourth direction DR4 of FIG. 1).

The first sensing electrodes Rx may be disposed to be spaced apart from each other in the second direction DR2 and the third direction DR3. The first sensing electrodes Rx spaced apart from each other in the second direction DR2 are connected to each other by the first bridge BD1. The second sensing electrodes Tx may be disposed to be spaced apart from each other in the second direction DR2 and the third direction DR3. The second sensing electrodes Tx spaced apart from each other in the third direction DR3 are connected to each other by the second bridge BD2. The second bridge BD2 may be disposed on (e.g., overlap) the first bridge BD1. Although not shown, an insulation layer (not shown) may be disposed between the second bridge BD2 and the first bridge BD1.

Although not shown in the drawings, the first sensing electrodes Rx and the second sensing electrodes Tx may be disposed on layers different from each other, respectively. The insulation layer (not shown) may be disposed between the first sensing electrode Rx and the second sensing electrode Tx, which are disposed on the layers different from each other.

Referring to FIG. 3, the sensor unit TSU includes the connection line TL electrically connected to the sensing electrode TE. The connection line TL may include a first connection line TL1 and a second connection line TL2. The first connection line TL1 may be connected to the first sensing electrode Rx. The second connection line TL2 may be connected to the second sensing electrode Tx.

Also, the connection line TL may be electrically connected to a touch pad part PD. The touch pad part PD may include the first touch pad PD1 and the second touch pad PD2. The first connection line TL1 connects the first sensing electrode Rx to the first touch pad PD1, and the second connection line TL2 connects the second sensing electrode Tx to the second touch pad PD2.

At least one of the sensing electrode TE or the connection line TL of the sensor unit TSU of FIG. 3 may include a conductive pattern layer having a nanostructure. Although not illustrated in FIG. 3, the conductive pattern layer may include a base part, a plurality of protrusions, and a plurality of holes, as will become more apparent below.

Figure 4A:
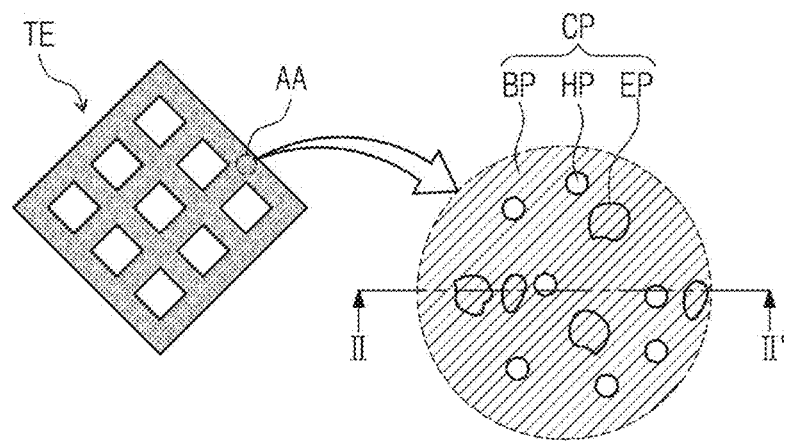
FIG. 4A is an enlarged plan view of a sensing electrode of the sensor unit of FIG. 3 according to one or more exemplary embodiments.
Figure 4B:
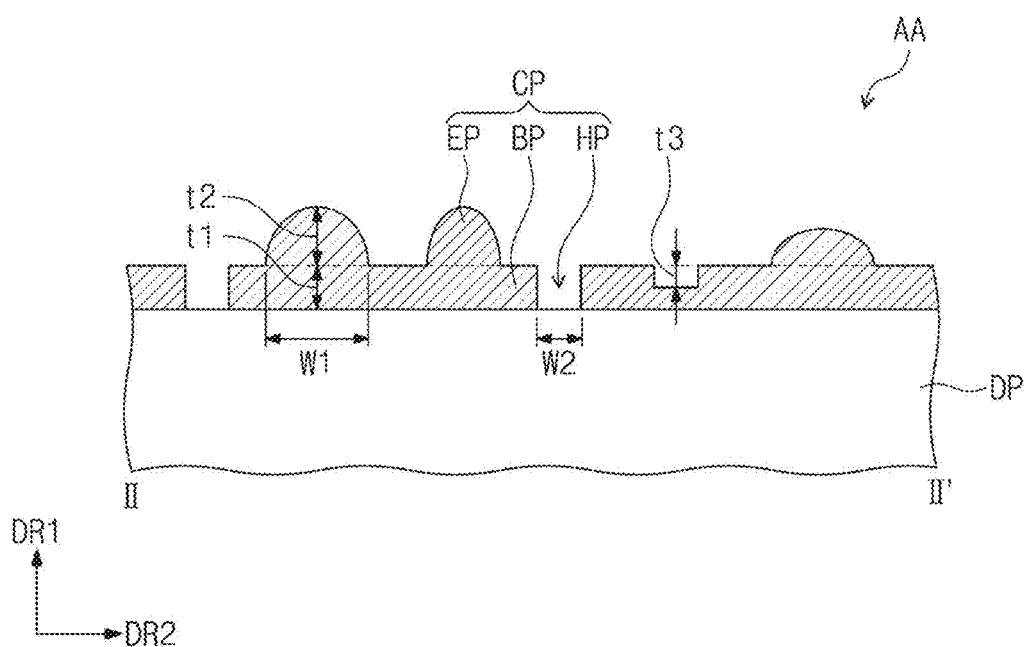
FIG. 4B is a cross-sectional view of the sensing electrode of FIG. 4A taken along sectional line II-IP in an area AA according to one or more exemplary embodiments.

FIG. 4A is an enlarged plan view of a sensing electrode of the sensor unit of FIG. 3 according to one or more exemplary embodiments. FIG. 4B is a cross-sectional view of the sensing electrode of FIG. 4A taken along sectional line II-IP in an area AA according to one or more exemplary embodiments.

Referring to FIGS. 4A and 4B, the sensing electrode TE may include a conductive pattern layer CP. The conductive pattern layer CP may include a base part BP, a plurality of protrusions EP, and a plurality of holes HP. The conductive pattern layer CP may be disposed on the display panel DP. Although not shown in the drawings, the conductive pattern layer CP may be disposed on the encapsulation layer TFE (see FIG. 2) of the display panel DP.

The base part BP of the conductive pattern layer CP may be a flat layer having a determined thickness t1. The base part BP may have a thickness t1 of about 60 Å to about 460 Å. For instance, the base part BP may have a thickness t1 of about 100 Å to about 200 Å. When the base part BP has a thickness of about 60 Å or less, the conductive pattern layer CP may not be stable and an electrical short-circuit may occur, e.g., the conductive pattern layer CP may develop a crack. When the base part BP has a thickness of about 460 Å or more, the conductive pattern layer CP may not have flexibility, e.g., the conductive pattern layer CP will become too rigid, and, as such, the display panel DP may also be too rigid.

The protrusions EP of the conductive pattern layer CP may be randomly disposed on the base part BP. Each of the protrusions EP may protrude in a thickness direction with respect to the base part BP. For example, the protrusions EP may be portions that protrude in the first direction DR1. Each of the protrusions EP may have a circular shape, an oval shape, or a polygonal shape on a plane. Also, the protrusions EP and the holes HP may be randomly disposed and/or may be amorphous.

The conductive pattern layer CP may be made of a conductive material. The conductive pattern layer CP may include silver (Ag). Also, the conductive pattern layer CP may include an Ag alloy. For example, the Ag alloy may contain Ag as a main component and may additionally include at least one of indium (In), zinc (Zn), gold (Au), nickel (Ni), cobalt (Co), copper (Cu), bismuth (Bi), antimony (Sb), or aluminum (Al). In an exemplary embodiment, the conductive pattern layer CP may be made of only an alloy of Ag and In.

The conductive pattern layer CP may be formed through a deposition method. The conductive pattern layer CP may be formed by depositing Ag or an Ag alloy through sputtering. When the conductive pattern layer CP is formed, a thermal treatment process may be performed after depositing the Ag or Ag alloy. The thermal treatment process may be performed at a temperature of about 150° C. or more. For example, the thermal treatment process may be performed at a temperature of about 150° C. to about 250° C. The thermal treatment process may be performed for a time of about 10 minutes to about 30 minutes. When the thermal treatment process is performed for a time of about 10 minutes or less, the protrusions EP and the holes HP, each of which has a nanostructure, may not be formed. Also, when the thermal treatment time exceeds about 30 minutes, surface resistance may rapidly increase and electrical characteristics of the conductive pattern layer CP deteriorate. In an exemplary embodiment, the thermal treatment process may be performed for about 20 minutes at a temperature of about 230° C.

When the thermal treatment process is performed after the deposition, the conductive pattern layer CP may include the protrusions EP and the holes HP. That is, the Ag or Ag alloy that is a conductive material deposited while the thermal treatment process is performed at a relatively high temperature may be self-assembled, and thus, the conductive pattern layer CP may be formed to have a determined nanostructure including the plurality of protrusions EP and the plurality of holes HP.

A process of depositing the conductive pattern layer CP may be performed at a high temperature. The process of depositing the conductive pattern layer CP may be performed at a temperature of about 80° C. to about 200° C. For example, a base member on which the Ag or Ag alloy for forming the conductive pattern layer CP is deposited may be adjusted to a temperature of about 80° C. to about 200° C. For example, the base member may be the encapsulation layer TFE (see FIG. 2), but exemplary embodiments are not limited thereto or thereby. When the Ag or Ag alloy is deposited at a temperature of about 80° C. to about 200° C., the Ag or Ag alloy that is the deposited conductive material may be self-assembled, and thus, the conductive pattern layer CP may be formed to have the determined nanostructure including the plurality of protrusions EP and the plurality of holes HP.

When the conductive pattern layer CP including the Ag or Ag alloy is formed through the high-temperature deposition process, the above-described thermal treatment process may be omitted. That is, the conductive pattern layer CP may have the determined nanostructure including the plurality of protrusions EP and the plurality of holes HP even though an additional thermal treatment process is not performed after the deposition process.

The protrusions EP and the holes HP may increase the flexibility of the conductive pattern layer CP. For example, the protrusions EP and the holes HP may reduce stress applied to the conductive pattern layer CP. The protrusions EP and the holes HP may function as a dam that prevents (or reduces) the stress from being transmitted to the conductive pattern layer CP.

The protrusions EP of the conductive pattern layer CP may be distributed with a density of about 0.3 protrusions to about 10 protrusions within an area of about 1 μm². When the protrusions EP of the conductive pattern layer CP are distributed with a density less than that of about 0.3 protrusions per μm² or greater than that of about 10 protrusions per μm², the flexibility of the conductive pattern layer CP may not be secured.

Also, the protrusions EP may have a mean size of about 10 nm to about 1,000 nm. The size of each of the protrusions EP may be obtained by measuring a maximum width of each of the protrusions EP on the plane. In FIG. 4B, a size W1 of each of the protrusions EP may be a size of a portion having a maximum width of each of the protrusions EP on the plane. The protrusions EP may have sizes different from each other. When each of the protrusions EP of the conductive pattern layer CP has a size W1 that is less than that of about 10 nm or greater than that of about 1,000 nm, the flexibility of the conductive pattern layer CP may not be secured.

The protrusions EP may be disposed to protrude with respect to the base part BP. The protrusions EP may have a mean protruding thickness t2 of about 30 nm to about 300 nm. Referring to FIG. 4B, each of the protrusions EP may have a thickness t2 corresponding to a maximum height of each of the protrusions EP with respect to the base part BP. When each of the protrusions EP has a thickness t2 of about 30 nm or less, the protrusion EP may not function as the dam that prevents the stress from being transmitted. When each of the protrusions EP has a thickness t2 greater than that of 300 nm, the total thickness of the conductive pattern layer CP may increase to reduce the flexibility of the conductive pattern layer CP.

The holes HP may be recessed with respect to the base part BP. The base part BP may be completely removed in the holes HP, and thus, a portion of the display panel DP under the conductive pattern layer CP may be exposed. Also, on the other hand, only a portion of the base part BP may be removed in each of the holes HP. In this manner, some of the holes HP may be through-holes and some of the holes HP may be blind holes. When the base part BP is completely removed, each of the holes HP may have a depth corresponding to the thickness t1 of the base part BP. When only a portion of the base part BP is removed, each of the holes HP may have a depth t3 less than the thickness t1 of the base part BP.

The holes HP of the conductive pattern layer CP may be distributed with a density of about 5 holes to about 100 holes within an area of about 1 $\mu m^2$. When the holes HP of the conductive pattern layer CP are distributed with a density less than that of about 5 holes per $\mu m^2$ or greater than that of about 100 holes per $\mu m^2$, the flexibility of the conductive pattern layer CP may not be secured.

Also, the holes HP may have a mean size of about 2 nm to about 3,000 nm. The size of each of the holes HP may be obtained by measuring a maximum width of each of the holes HP on the plane. In FIG. 4B, a size W2 of each of the holes HP may be a size of a portion having a maximum width of each of the holes HP on the plane. The holes HP may have sizes different from each other. When each of the holes HP of the conductive pattern layer CP has a size W2 less than that of about 2 nm, the flexibility of the conductive pattern layer CP may not be secured. Also, when each of the holes HP of the conductive pattern layer CP has a size W2 greater than that of about 3000 nm, the electrical characteristics of the conductive pattern layer CP may be deteriorated and an electrical short-circuit or increase in resistance may occur.

Figure 4C:
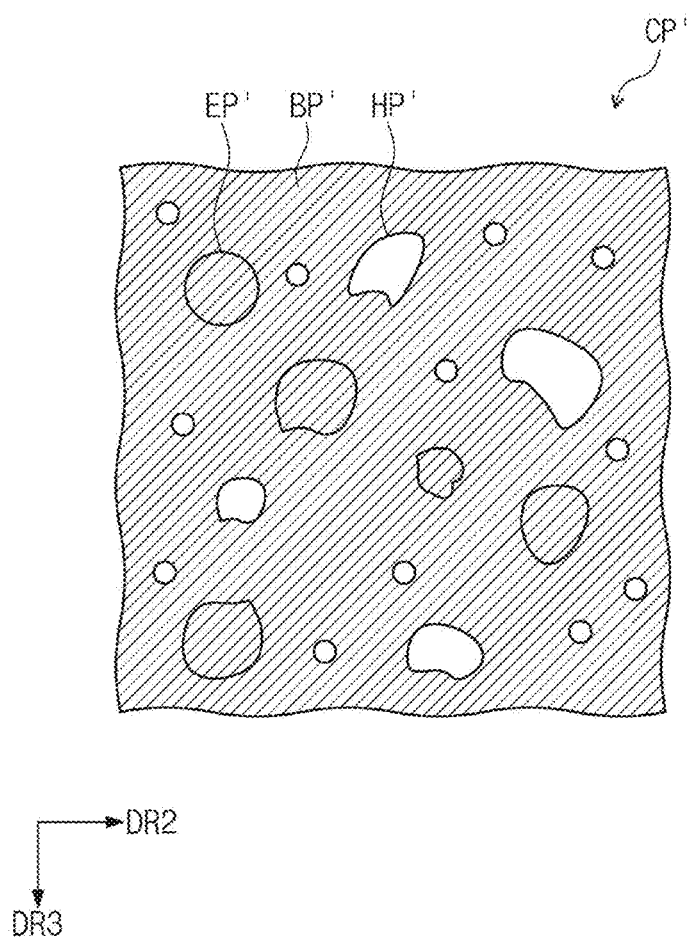
FIG. 4C is a plan view of a conductive pattern layer according to one or more exemplary embodiments.

FIG. 4C is a plan view of a conductive pattern layer according to one or more exemplary embodiments. The conductive pattern layer CP' of FIG. 4C is similar to the conductive pattern layer CP of FIGS. 4A and 4B. As such, primarily differences are described below to avoid obscuring exemplary embodiments.

Referring to FIG. 4C, the conductive pattern layer CP' may include a base part BP', a plurality of protrusions EP', and a plurality of holes HP'. Each of the protrusions EP' and the holes HP' may have an amorphous shape. The conductive pattern layer CP' may include the plurality of protrusions EP' and the plurality of holes HP', which are randomly disposed and each of which has the amorphous shape. Thus, an electrode and a line, which include the conductive pattern layer CP', may have flexibility. That is, when the sensing electrode TE is formed by using the conductive pattern layer CP' including the protrusions EP' and the holes HP', the sensing electrode TE may have flexibility.

Although the sensing electrode TE of the sensor unit TSU (see FIG. 3) is provided in the conductive pattern layer CP or CP' in FIGS. 4A to 4C, exemplary embodiments are not limited thereto or thereby. The above-described conductive pattern layer CP or CP' may be provided in the connection line TL (see FIG. 3).

In an exemplary embodiment, the connection line TL (see FIG. 3) of the sensor unit TSU (see FIG. 3) may include the conductive pattern layer CP or CP' including the base part BP or BP', the plurality of protrusions EP or EP', and the plurality of holes HP or HP'. The connection line TL (see FIG. 3) may include the conductive pattern layer CP or CP' having the determined nanostructure including the protrusions EP or EP' and the holes HP or HP', and thus, have flexibility. Also, in an exemplary embodiment, each of the sensing electrode TE (see FIG. 3) and the connection line TL (see FIG. 3) of the sensor unit TSU (see FIG. 3) may be formed to be provided with the conductive pattern layer CP or CP' including the plurality of protrusions EP or EP' and the plurality of holes HP or HP'. Thus, in an exemplary embodiment, the sensor unit TSU may have flexibility. In addition, the display apparatus DD (see FIG. 1) including the sensor unit TSU may also have flexibility.

Figure 5A:
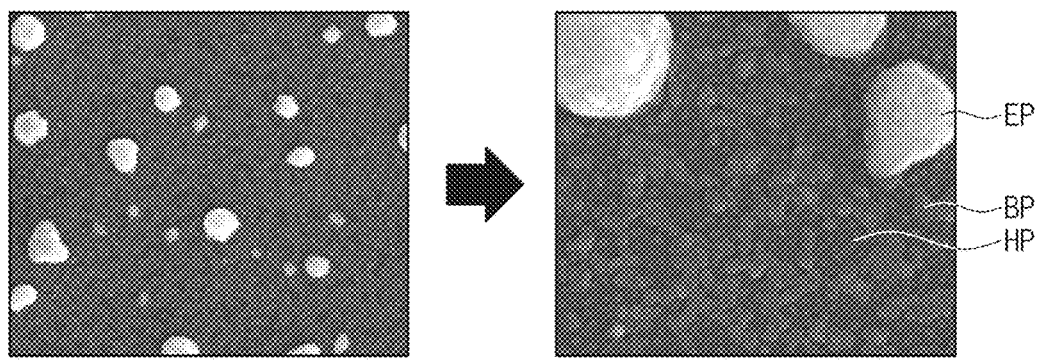
FIGS. 5A, 5B and 5C are scanning electron microscope images of a conductive pattern layer according to one or more exemplary embodiments.
Figure 5B:
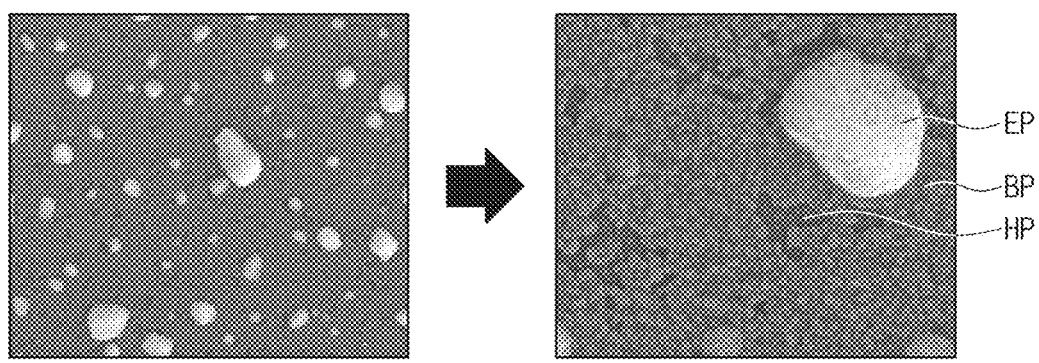
Figure 5C:
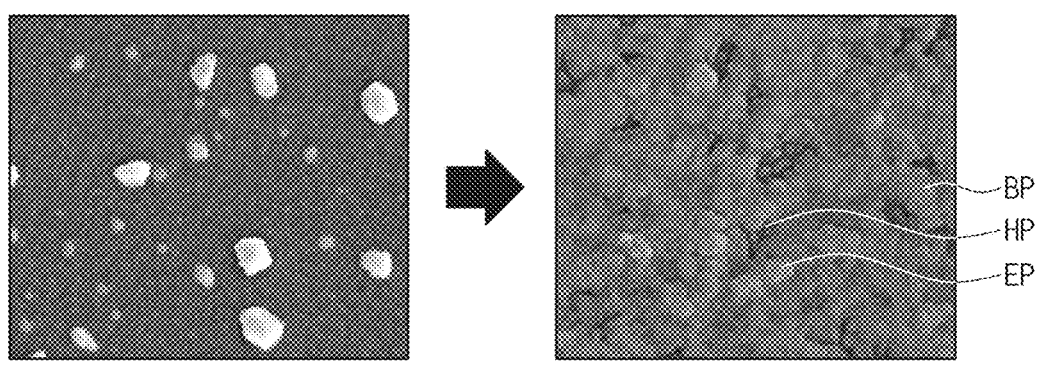

FIGS. 5A, 5B and 5C are scanning electron microscope (SEM) images of a conductive pattern layer according to one or more exemplary embodiments. FIGS. 5A, 5B, and 5C illustrates images of a plane of the conductive pattern layer magnified about 30,000 times to about 150,000 times. The base part BP in FIGS. 5A to 5C has a thickness of about 100 Å, about 150 Å, and about 200 Å, respectively. In each of FIGS. 5A to 5C, a left image represents a surface of the conductive pattern layer CP that is photographed with magnification at about 30,000 times, and a right image represents a surface of the conductive pattern layer CP with magnification at about 150,000 times.

Referring to FIGS. 5A to 5C, the conductive pattern layer CP may include a base part BP, randomly protruding protrusions EP, and holes HP that are randomly defined. As can be appreciated from the images, each of the protrusions EP and the holes HP may also have a random and amorphous shape.

With reference to FIG. 3, at least one of the sensing electrode TE and the connection line TL of the sensor unit TSU may include a conductive pattern layer CP or CP' and a transparent conductive layer. In this manner, the display apparatus DD may include the sensing electrode TE and/or the connection line TL that includes at least one transparent conductive layer and is provided as a plurality of layers. As such, since the conductive pattern layer CP or CP' has the nanostructure including the base part BP or BP', the protrusions EP or EP', and the holes HP or HP', the conductive pattern layer CP or CP' may have flexibility. An exemplary structure is described in more detail in association with FIG. 6.

Figure 6:
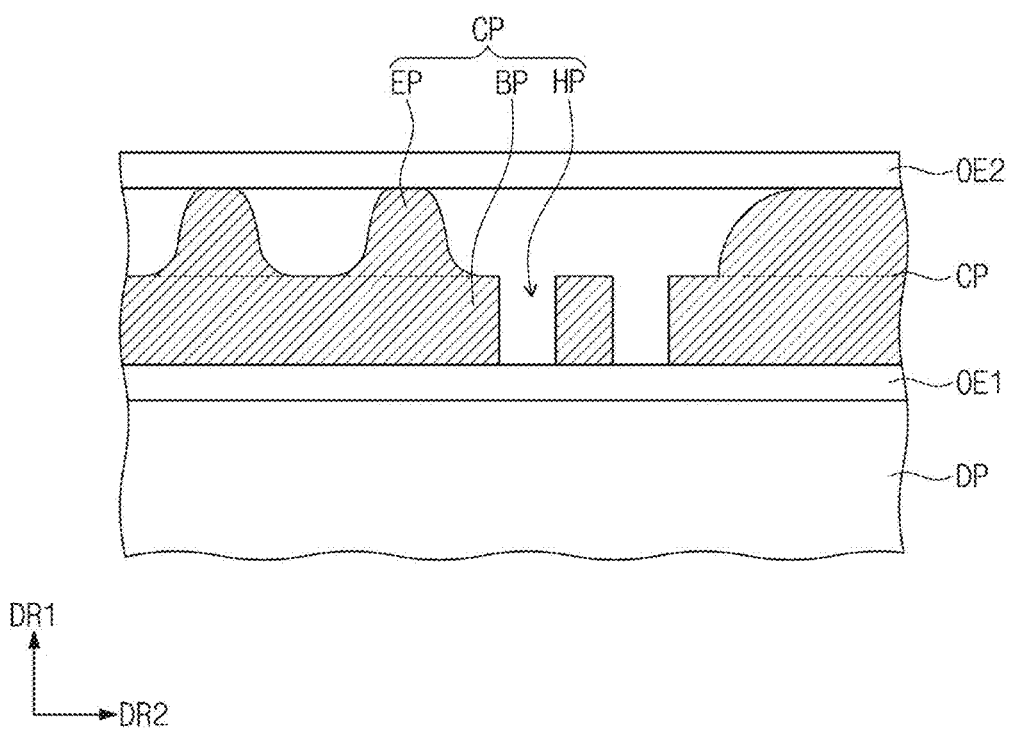
FIG. 6 is a cross-sectional view of a conductive pattern layer according to one or more exemplary embodiments.

FIG. 6 is a cross-sectional view of a conductive pattern layer according to one or more exemplary embodiments. For descriptive and illustrative convenience, FIG. 6 is described in association with the conductive pattern layer CP of FIG. 4A.

Referring to FIG. 6, first transparent conductive layer OE1 and second transparent conductive layer OE2 may be further disposed on at least one surface of the top and bottom surfaces of the conductive pattern layer CP. For example, the first transparent conductive layer OE1 may be disposed between the conductive pattern layer CP and the display panel DP, and the second transparent conductive layer OE2 may be disposed on the top surface of the conductive pattern layer CP to protect the conductive pattern layer CP. In an exemplary embodiment, the sensing electrode TE and/or the connection line TL may be provided with a structure in which the conductive pattern layer CP and the first transparent conductive layer OE1 and the second transparent conductive layer OE2 are laminated (or stacked). The sensing electrode TE and/or the connection line TL may have a structure in which the first transparent conductive layer OE1 and the conductive pattern layer CP are laminated. As another example, the sensing electrode TE and/or the connection line TL may have a structure in which the first transparent conductive layer OE1, the conductive pattern layer CP, and the second transparent conductive layer OE2 are laminated in the first direction.

The first transparent conductive layer OE1 and the second transparent conductive layer OE2 may include at least one of indium tin oxide (ITO), indium zinc oxide (IZO), zinc oxide (ZnO), and indium tin zinc oxide (ITZO), however, exemplary embodiments are not limited thereto or thereby. The first transparent conductive layer OE1 and the second transparent conductive layer OE2 may have a thickness less than that of the conductive pattern layer CP. For example, each of the first transparent conductive layer OE1 and the second transparent conductive layer OE2 may have a thickness of about 50 Å to about 100 Å. When each of the first transparent conductive layer OE1 and the second transparent conductive layer OE2 has a thickness of about 50 Å or less, an effect of protecting the conductive pattern layer CP may not be secured. Also, when each of the transparent conductive layers OE1 and OE2 has a thickness exceeding about 100 Å, the display apparatus DD may be reduced in flexibility.

In FIG. 6, the first transparent conductive layer OE1 and the second transparent conductive layer OE2 may be disposed on the top and bottom surfaces of the conductive pattern layer CP, respectively. In an exemplary embodiment, when the transparent conductive layer between the conductive pattern layer CP and the display panel DP is referred to as the first transparent conductive layer OE1, and the transparent conductive layer disposed on the top surface of the conductive pattern layer CP is referred to as the second transparent conductive layer OE2, the first transparent conductive layer OE1 and the second transparent conductive layer OE2 may include the same electrode material. It is contemplated, however, that the first transparent conductive layer OE1 and the second transparent conductive layer OE2 may have materials different from each other.

In one or more exemplary embodiments, the first transparent conductive layer OE1 and the second transparent conductive layer OE2 may have the same thickness. However, exemplary embodiments are not limited thereto or thereby. For example, the first transparent conductive layer OE1 and the second transparent conductive layer OE2 may have thicknesses different from each other.

According to an exemplary embodiment, each of the first transparent conductive layer OE1 and the second transparent conductive layer OE2 may be an ITO electrode layer. Also, each of the first transparent conductive layer OE1 and the second transparent conductive layer OE2 may have a thickness of about 70 Å.

As previously mentioned, the display apparatus DD may, in association with the structure of FIG. 6, include the sensing electrode TE or the connection line TL that includes the transparent conductive layer and is provided as a plurality of layers. In this manner, the conductive pattern layer CP has the nanostructure including the base part BP, the protrusions EP, and the holes HP, and, as such, the conductive pattern layer CP may have flexibility.

Also, in an exemplary embodiment, the conductive pattern layer CP or CP' made of the Ag or Ag alloy may be superior in crystal growth in a (111) orientation. For example, in the conductive pattern layer CP or CP', the Ag or Ag alloy may have an X-ray diffraction intensity of a (111) orientation crystal plane that is greater by 3 times than an X-ray diffraction intensity of a (220) orientation crystal plane.

Figure 7:
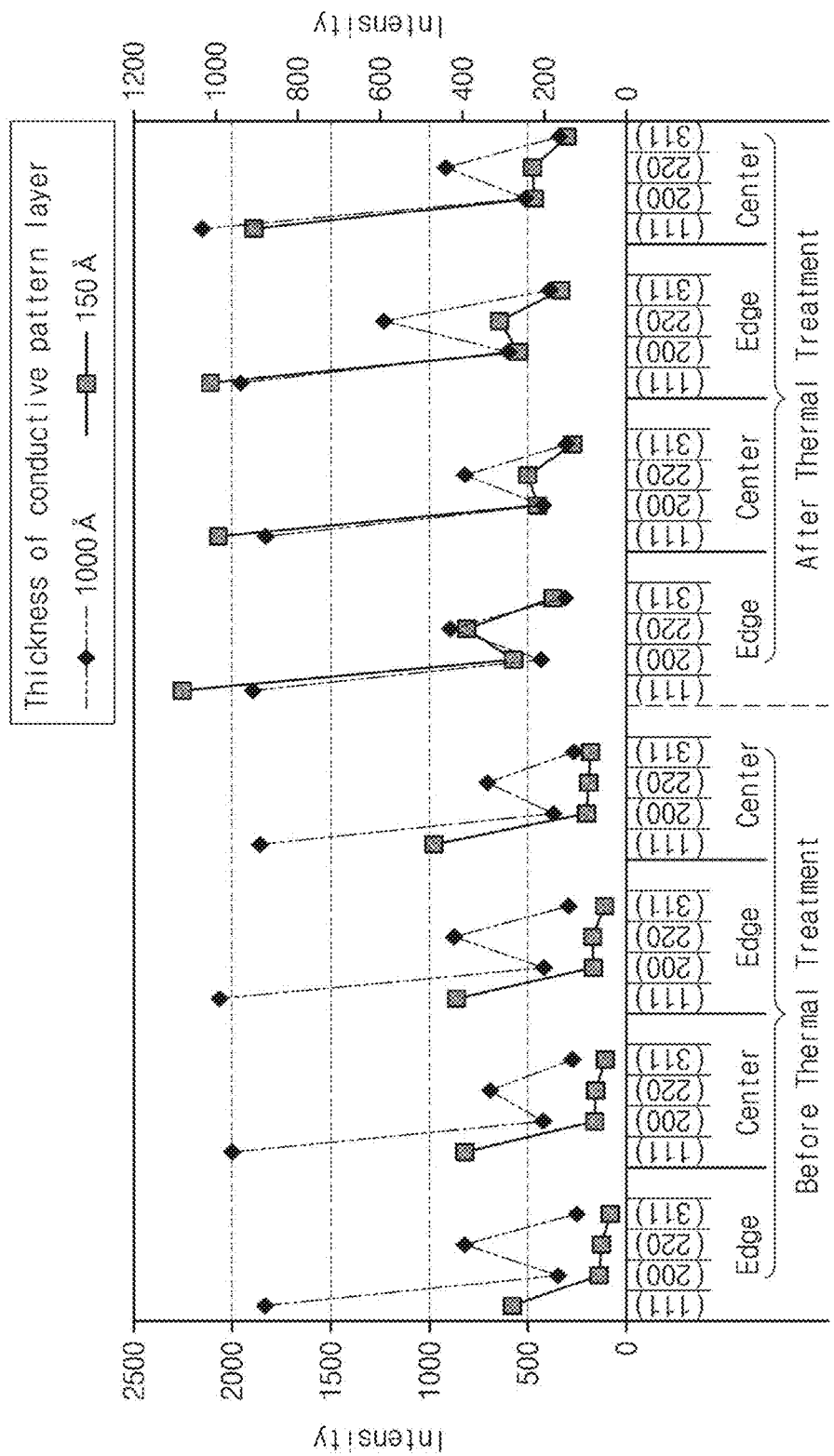
FIG. 7 is a view illustrating an X-ray analysis result of the conductive pattern layer of FIG. 6 according to one or more exemplary embodiments.

FIG. 7 is a view illustrating an X-ray analysis result of the conductive pattern layer of FIG. 6 according to one or more exemplary embodiments.

Referring to FIG. 7, the Ag of the conductive pattern layer CP may have signal crystallinity in the (111) orientation. As such, FIG. 7 illustrates results obtained by evaluating a crystal growth orientation of the Ag with respect to a sample in which the first transparent conductive layer OE1, the conductive pattern layer CP including an Ag/In alloy, and the second transparent conductive layer OE2 are successively laminated. In FIG. 7, an "edge" represents an edge portion of the test sample, and a "center" represents a central portion of the test sample. Also, "before the thermal treatment" represents a time after the conductive pattern layer CP is deposited, and "after the thermal treatment" represents a time after the conductive pattern layer CP is thermally processed at a high temperature after the deposition, as previously described. Also, the X-ray analysis was performed with the conductive pattern layer CP having thicknesses of about 150 Å and about 1000 Å.

Referring to the results in FIG. 7, it is seen that the Ag has superior crystal growth in the (111) orientation regardless of thermal treatment of the conductive pattern layer CP. That is, when the conductive pattern layer CP has a thickness of about 150 Å, it is seen that the X-ray diffraction intensity that represents crystallinity in the (111) orientation increases more after the thermal treatment.

Figure 8:
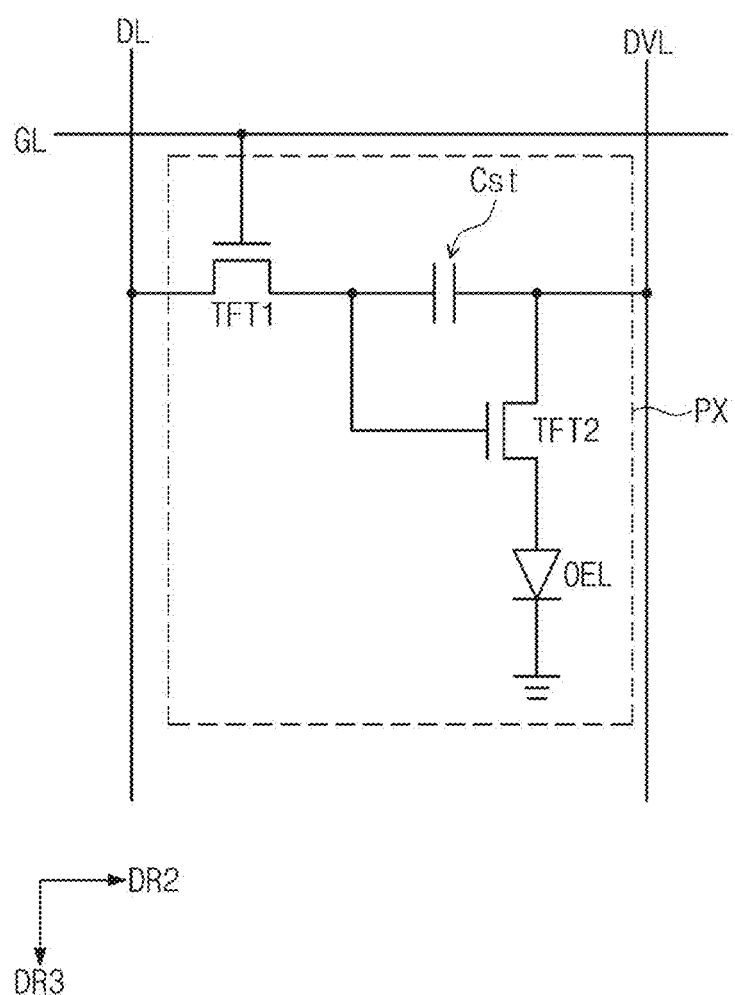
FIG. 8 is an equivalent circuit of a pixel of the display apparatus of FIGS. 1 and 2 according to one or more exemplary embodiments.
Figure 9:
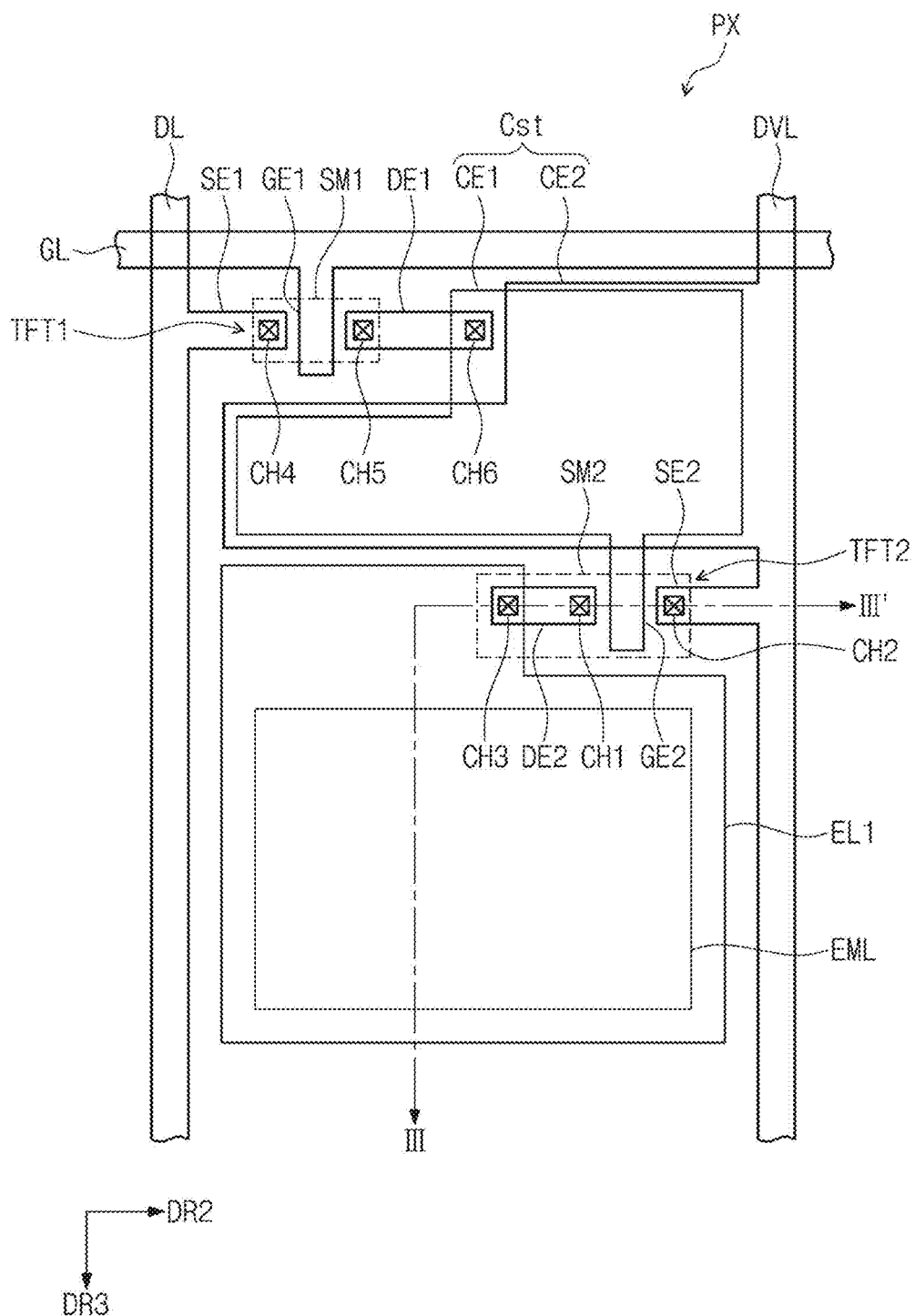
FIG. 9 is a plan view of a pixel of a display panel of the display apparatus of FIGS. 1 and 2 according to one or more exemplary embodiments.
Figure 10:
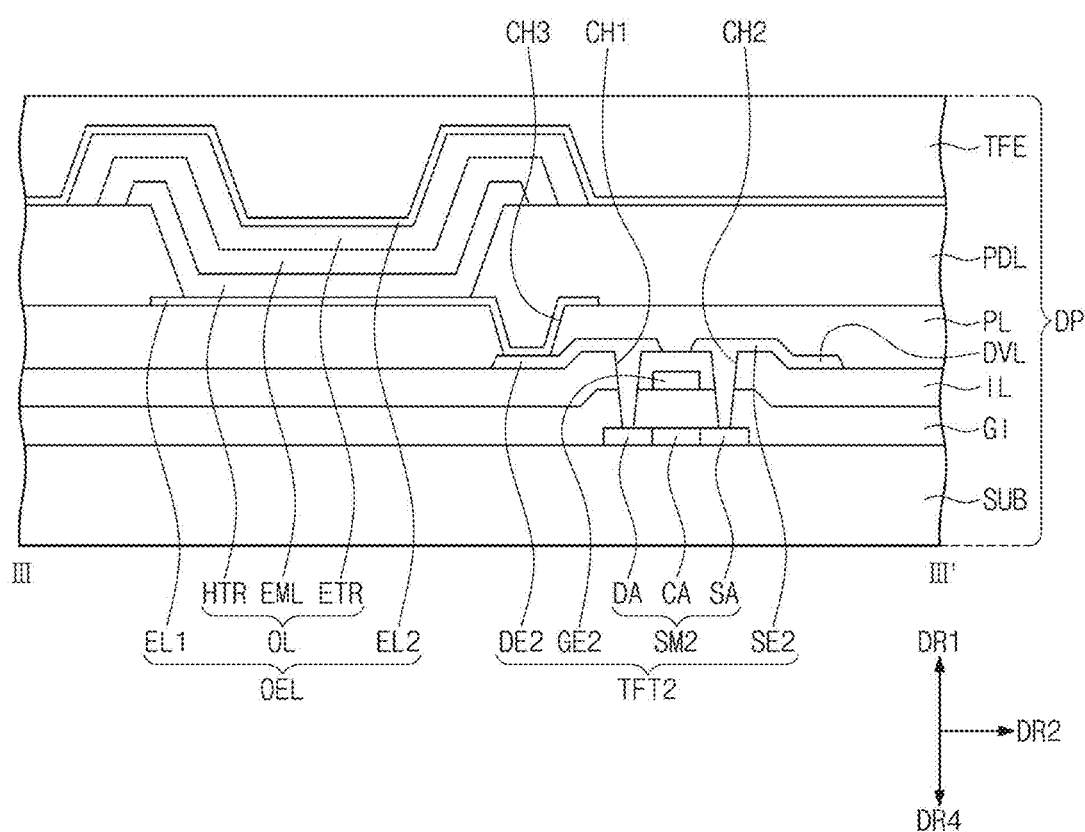
FIG. 10 is a cross-sectional view of the display panel of FIG. 9 taken along sectional line III-III' according to one or more exemplary embodiments.

FIGS. 8, 9, and 10 are views of a pixel in the display panel DP of FIGS. 1 and 2 according to various exemplary embodiments. FIG. 8 is an equivalent circuit of a pixel of the display apparatus of FIGS. 1 and 2 according to one or more exemplary embodiments. FIG. 9 is a plan view of a pixel of a display panel of the display apparatus of FIGS. 1 and 2 according to one or more exemplary embodiments. FIG. 10 is a cross-sectional view of the display panel of FIG. 9 taken along sectional line III-III' according to one or more exemplary embodiments.

Referring to FIGS. 8 and 9, each of pixels PX may be connected to a line part constituted by gate lines GL, data lines DL, and driving voltage lines DVL. Each of the pixels PX includes first thin film transistor TFT1 and second thin film transistor TFT2 connected to the line part, an organic electroluminescent device (OEL) connected to the thin film transistors TFT1 and TFT2, and a capacitor Cst. Although FIGS. 8 and 9 depict one pixel PX connected to one gate line GL, one data line DL, and one driving voltage line DVL, exemplary embodiments are not limited thereto or thereby. For example, a plurality of pixels PX may be connected to one gate line GL, one data line DL, and one driving voltage line DVL. Also, one pixel PX may be connected to at least one gate line GL, at least one data line DL, and at least one driving voltage line DVL. Further, pixel PX may include any number of thin film transistors and/or capacitors.

The gate lines GL extend in the second direction DR2. The data lines DL extend in the third direction DR3 crossing the gate lines GL. The driving voltage lines DVL extend in substantially the same direction as the data lines DL, i.e., in the third direction DR3. The gate lines GL transmit scanning signals into the first thin film transistor TFT1 and the second thin film transistor TFT2. The data lines DL transmit data signals into the first thin film transistor TFT1 and the second thin film transistor TFT2. The driving voltage lines DVL provide a driving voltage to the first thin film transistor TFT1 and the second thin film transistor TFT2.

Each of the pixels PX may emit light having a determined color, for example, one of red light, green light, and blue light. A kind of color light, however, is not limited to or by the aforementioned colors of light. For example, the color of light may further include white light, cyan light, magenta light, and/or yellow light. It is noted, however, that any other suitable color of light may be utilized in association with exemplary embodiments.

The first thin film transistor TFT1 and the second thin film transistor TFT2 may include a driving thin film transistor TFT2 for controlling the organic electroluminescent device OEL and a switching thin film transistor TFT1 for switching the driving thin film transistor TFT2. As such, the phrases first thin film transistor TFT1 and switching thin film transistor TFT1 will be used interchangeably. Also, the phrases second thin film transistor TFT2 and driving thin film transistor TFT2 will also be used interchangeably. Each of the pixels PX includes the first thin film transistor TFT1 and the second thin film transistor TFT2, but exemplary embodiments are not limited thereto or thereby. For example, each of the pixels PX may include one thin film transistor and one capacitor, may include at least three thin film transistors and at least two capacitors, etc.

The switching thin film transistor TFT1 includes a first gate electrode GE1, a first source electrode SE1, and a first drain electrode DE1 The first gate electrode GE1 is connected to the gate line GL, and the first source electrode SE1 is connected to the data line DL. The first drain electrode DE1 is connected to a first common electrode CE1 by a sixth contact hole CH6. The switching thin film transistor TFT1 transmits the data signals applied into the data line DL to the driving thin film transistor TFT2 according to the scanning signals applied into the gate line GL.

The driving thin film transistor TFT2 includes a second gate electrode GE2, a second source electrode SE2, and a second drain electrode DE2. The second gate electrode GE2 is connected to the first common electrode CE1. The second source electrode SE2 is connected to the driving voltage line DVL. The second drain electrode DE2 is connected to the first electrode EL1 by a third contact hole CH3.

The first electrode EL1 is connected to the second drain electrode DE2 of the driving thin film transistor TFT2. A common voltage is applied to the second electrode EL2 (see FIG. 10), and a light emitting layer EML emits light according to an output signal of the driving thin film transistor TFT2 to display an image. The first electrode EL1 and the second electrode EL2 will be described below in more detail.

The capacitor Cst is connected between the second gate electrode GE2 and the second source electrode SE2 of the driving thin film transistor TFT2 to charge and maintain the data signal input to the second gate electrode GE2 of the driving thin film transistor TFT2. The capacitor Cst may include the first common electrode CE1 connected to the first drain electrode DE1 by a sixth contact hole CH6 and a second common electrode CE2 connected to the driving voltage line DVL.

Referring to FIGS. 8 to 10, the display panel DP of the display apparatus DD may include the base substrate SUB, the first thin film transistor TFT1 and the second thin film transistor TFT2 disposed on the base substrate SUB, and the organic electroluminescent device OEL connected to the first thin film transistor TFT1 and the second thin film transistor TFT2.

The base substrate SUB may include a plastic substrate, a glass substrate, a metal substrate, and/or an organic/inorganic composite substrate. In this manner, the base substrate SUB may include one or more layers. The plastic substrate may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin. The base substrate SUB may be a flexible substrate. Alternatively, the base substrate SUB may be a rigid substrate or the base substrate SUB may include at least one flexible portion and at least one rigid portion. The material and structure of the base substrate SUB is not limited to or by the aforementioned materials and structures. That is, the base substrate SUB may be selected in consideration of mechanical strength, thermal stability, transparency, surface roughness, tractability, waterproofing, and the like. The base substrate SUB may be transparent.

A substrate buffer layer (not shown) may be disposed on the base substrate SUB. The substrate buffer layer may prevent (or reduce) impurities from being diffused into the switching thin film transistor TFT1 and the driving thin film transistor TFT2. The substrate buffer layer may be formed of at least one of $SiN_x$, $SiO_x$, and $SiO_xN_y$. Also, the substrate buffer layer may be omitted according to the material and process conditions of the base substrate SUB.

A first semiconductor pattern SM1 and a second semiconductor pattern SM2 are disposed on the base substrate SUB. Each of the first semiconductor pattern SM1 and the second semiconductor pattern SM2 is made of a semiconductor material. Also, the first semiconductor pattern SM1 and the second semiconductor pattern SM2 may function as active layers of the switching thin film transistor TFT1 and the driving thin film transistor TFT2, respectively. Each of the first semiconductor pattern SM1 and the second semiconductor pattern SM2 includes a source part SA, a drain part DA, and a channel part CA disposed between the source part SA and the drain part DA. Each of the first semiconductor pattern SM1 and the second semiconductor pattern SM2 may be made of a material selected from an inorganic semiconductor and an organic semiconductor. The source part SA and the drain part DA may be doped within n-type impurities or p-type impurities.

A gate insulation layer GI is disposed on the first semiconductor pattern SM1 and the second semiconductor pattern SM2. The gate insulation layer GI covers the first semiconductor pattern SM1 and the second semiconductor pattern SM2. The gate insulation layer GI may be formed of an inorganic insulation material.

First gate electrode GE1 and second gate electrode GE2 are disposed on the gate insulation layer GI. Each of the first gate electrode GE1 and second gate electrode GE2 covers an area corresponding to the channel part CA of each of the first semiconductor pattern SM1 and the second semiconductor pattern SM2.

A substrate insulation layer IL is disposed on the first gate electrode GE1 and the second gate electrode GE2. The substrate insulation layer IL covers the first gate electrode GE1 and the second gate electrode GE2. The substrate insulation layer IL may be made of an organic insulation material or inorganic insulation material.

The first source electrode SE1 and the first drain electrode DE1 and the second source electrode SE2 and the second drain electrode DE2 are disposed on the substrate insulation layer IL. The second drain electrode DE2 contacts the drain part DA of the second semiconductor pattern SM2 by a first contact hole CH1 defined in the gate insulation layer GI and the substrate insulation layer IL, and the second source electrode SE2 contacts the source part SA of the second semiconductor pattern SM2 by a second contact hole CH2 defined in the gate insulation layer GI and the substrate insulation layer IL. The first source electrode SE1 contacts a source part (not shown) of the first semiconductor pattern SM1 by a fourth contact hole CH4 defined in the gate insulation layer GI and the substrate insulation layer IL, and the first drain electrode DE1 contacts a drain part (not shown) of the first semiconductor pattern SM1 by a fifth contact hole CH5 defined in the gate insulation layer GI and the substrate insulation layer IL.

A passivation layer PL is disposed on the first source electrode SE1, the first drain electrode DE1, the second source electrode SE2, and the second drain electrode DE2. The passivation layer PL may function as a protection layer for protecting the switching thin film transistor TFT1 and the driving thin film transistor TFT2, and may also function as a planarization layer for planarizing top surfaces overlapping the switching thin film transistor TFT1 and the driving thin film transistor TFT2.

The first electrode EL1 is disposed on the passivation layer PL and is connected to the second drain electrode DE2 of the driving thin film transistor TFT2 through the third contact hole CH3 defined in the passivation layer PL.

A pixel defining layer PDL including openings corresponding to the light emitting layers EML respectively corresponding to the pixels PX is disposed on the passivation layer PL. The pixel defining layer PDL exposes a top surface of the first electrode EL1 and protrudes away from the base substrate SUB, e.g., protrudes in the first direction DR1. The pixel defining layer PDL may include a material including a metal-fluorine ion compound, but exemplary embodiments are not limited thereto or thereby. For example, the pixel defining layer PDL may be made of at least one metal-fluorine ion compound, e.g., at least one of lithium fluoride (LiF), barium fluoride ($BaF_2$), and cesium fluoride (CsF). If the metal-fluorine ion compound has a determined thickness, the metal-fluorine ion compound may have an insulating property. For example, the pixel defining layer PDL may have a thickness of about 10 nm to about 100 nm.

The organic electroluminescent device OEL is disposed on an area that is surrounded by the pixel defining layer PDL. The organic electroluminescent device OEL includes the first electrode EL1, an organic layer OL, and the second electrode EL2 that are successively laminated or stacked on passivation layer PL. The organic layer OL may include a hole transport region HTR, the light emitting layer EML, and an electron transport region ETR.

The first electrode EL1 may have conductivity. The first electrode EL1 may be a pixel electrode or positive electrode. The first electrode EL1 may be a transmissive electrode, a transflective electrode, or a reflective electrode. When the first electrode EL1 is a transmissive electrode, the first electrode EL1 may be formed of metal oxide, for example, indium tin oxide (ITO), indium zinc oxide (IZO), zinc oxide (ZnO), or indium tin zinc oxide (ITZO); however, exemplary embodiments are not limited thereto or thereby. When the first electrode EL1 is the transflective or reflective electrode, the first electrode EL1 may include at least one of Ag, magnesium (Mg), Al, platinum (Pt), palladium (Pd), Au, Ni, neodymium (Nd), iridium (Ir), and chromium (Cr); however, exemplary embodiments are not limited thereto or thereby.

The organic layer OL is disposed on the first electrode ELL The organic layer OL includes the light emitting layer EML. The organic layer OL may further include the hole transport region HTR and the electron transport region ETR.

The hole transport region HTR is defined above the first electrode ELL The hole transport region HTR may include at least one of a hole injection layer, a hole transport layer, a buffer layer, or an electron stop layer. The hole transport region HTR may have a single layer made of a single material, a single layer made of materials different from each other, or a multi-layered structure including a plurality of layers made of materials different from each other.

For example, the hole transport region HTR may have single layer structure formed of a plurality of different materials or a structure of the hole injection layer/the hole transport layer, the hole injection layer/the hole transport layer/the buffer layer, the hole injection layer/the buffer layer, the hole transport layer/the buffer layer, or the hole injection layer/the hole transport layer/the electron stop layer, but exemplary embodiments are not limited thereto or thereby.

When the hole transfer region HTR includes the hole injection layer, the hole transfer region HTR may include a phthalocyanine compound, such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-Tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), and polyaniline/poly(4-styrenesulfonate) (PANI/PSS), but exemplary embodiments are not limited thereto or thereby.

When the hole transfer region HTR includes the hole transfer layer, the hole transfer region HTR may include, for example, a carbazole-based derivative, such as N-phenylcarbazole and polyvinylcabazole, a fluorene-based derivative, a triphenylamine-based derivative, such as N,N'-bis(3-methylphenyl)-N,N'-diphenyl-[1,1-biphenyl]-4,4'-diamine (TPD) and 4,4',4"-tris(N-carbazolyl)triphenylamine (TCTA), N,N'-di(1-naphthyl)-N,N'-diphenylbenzidine (NPB), or 4.4'-Cyclohexylidene bis[N,N-bis(4-methylphenyl)benzenamine] (TAPC), but exemplary embodiments are not limited thereto or thereby.

The light emitting layer EML may be disposed on the hole transport region HTR. The light emitting layer EML may have a single layer structure formed of a single material, a single layer structure formed of materials different from each other, or a multi-layered structure including a plurality of layers formed of materials different from each other.

The light emitting layer EML may be formed of any suitable material capable of emitting light of one or more colors. For example, the light emitting layer EML may be formed of materials that emit red, green, and blue colors. The light emitting layer may include a phosphor material and a fluorescent material. Also, the light emitting layer EML may include a host or dopant.

The host may be any suitable material. For example, the host may include at least one of $Alq_3$(tris(8-hydroxyquinolinato)aluminum), CBP(4,4'-bis(N-carbazolyl)-1,1'-biphenyl), PVK(poly(N-vinylcabazole)), ADN(9,10-di(naphthalene-2-yl)anthracene), TCTA(4,4',4"-Tris(carbazol-9-yl)-triphenylamine), TPBi(1,3,5-tri(1-phenyl-1H-benzo[d]imidazole-2-yp)benzen), TBADN(3-tert-butyl-9,10-di(naphth-2-yl)anthracene), DSA(distyrylarylene), CDBP (4.4'-bis(9-carbazolyl)-2,2'-dimethyl-biphenyl), and MADN (2-Methyl-9,10-bis(naphthalen-2-yl)anthracene).

When the light emitting layer EML emits red light, the light emitting layer EML may include, for example, a phosphor material including, for example, tris(dibenzoyl-methanato) phenanthoroline europium (PBD:Eu(DBM)3 (Phen)) and perylene. When the light emitting layer EML emits red light, the dopant material contained in the light emitting layer EML may be, for example, a metal complex or an organometallic complex, such as bis(1-phenylisoquinoline) acetylacetonate iridium (PIQIr(acac)), bis(1-phenylquinoline)acetylacetonate iridium (PQIr(acac)), tris(1-phenylquinoline)iridium (PQIr), and/or octaethylporphyrin platinum (PtOEP).

When the light emitting layer EML emits green light, the light emitting layer EML may include, for example, a fluorescent material including $Alq_3$(tris(8-hydroxyquinolinato) aluminum. When the light emitting layer EML emits the green light, the dopant contained in the light emitting layer EML may be, for example, a metal complex or an organometallic complex, such as Ir(ppy)3(fac-tris(2-phenylpyridine)iridium.

When the light emitting layer EML emits blue light, the light emitting layer EML may include, for example, a fluorescent material including at least one selected from the group consisting of spiro-DPVBi, spiro-6P, distyryl-benzene (DSB), distyryl-arylene (DSA), polyfluorene (PFO)-based polymer, and poly(p-phenylene vinylene) (PPV)-based polymer. The dopant in the light emitting layer EML that emits the blue light, may be, for example, a metal complex or organometallic complex, such as (4,6-F2ppy)2Irpic. The light emitting layer EML will be described below in more detail.

The electron transport region ETR may be disposed on the light emitting layer EML. The electron transport region ETR may include at least one of a hole stop layer, an electron transport layer, and an electron injection layer, but exemplary embodiments are not limited thereto or thereby.

When the electron transport region ETR includes the electron transport layer, the electron transport region ETR may include Tris(8-hydroxyquinolinato)aluminum ($Alq_3$), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4-(Naphthalen-1-yl)-3,5-diphenyl-4H-1,2,4-triazole (NTAZ), 2-(4-Biphenylyl)-5-(4-tert-butylphenyl)-1,3,4-oxadiazole (tBu-PBD), Bis(2-methyl-8-quinolinolato-N1,O8)-(1,1'-Biphenyl-4-olato)aluminum (BAlq), berylliumbis(benzoquinolin-10-olate (Bebq2), 9,10-di(naphthalene-2-yl) anthracene (AND), and a mixture thereof, but exemplary embodiments are not limited thereto or thereby.

When the electron transport region ETR includes the electron injection layer, the electron transport region ETR may be formed of a material selected from at least one of lanthanum metals, such as LiF, lithium quinolate (LiQ), lithium oxide ($Li_2O$), barium oxide (BaO), sodium chloride (NaCl), CsF, and ytterbium (Yb), and metal halides, such as rubidium chloride (RbCl) and rubidium iodide (RbI). The electron injection layer may be formed of a mixture of the material for the electron transport material and an organometallic salt. The organometallic salt may be a material having an energy band gap of about 4 eV or more. For example, the organometallic salt may include at least one of metal acetate, metal benzoate, metal acetoacetate, metal acetylacetonate, and metal stearate. Each of the electron injection layers may have a thickness of about 1 Å to about 100 Å, for example, about 3 Å to about 90 Å. When each of the electron injection layers has a thickness within the aforementioned ranges, satisfactory electron injection characteristics may be achieved without substantially increasing a driving voltage.

The second electrode EL2 may be disposed on the organic layer OL, e.g., on the electron transport region ETR. The second electrode EL2 may be a common electrode or negative electrode. The second electrode EL2 may be a transmissive electrode, a transflective electrode, or a reflective electrode. When the second electrode EL2 is a transmissive electrode, the second electrode EL2 may include at least one of lithium (Li), calcium (Ca), LiF/Ca, LiF/Al, Al, Mg, BaF, and Ag, or a compound or mixture (e.g., a mixture of Ag and Mg) thereof.

When the second electrode EL2 is a transflective electrode or a reflective electrode, the second electrode EL2 may include at least one of Ag, Mg, Cu, Al, Pt, Pd, Au, Ni, Nd, Ir, Cr, Li, Ca, LiF/Ca, LiF/Al, molybdenum (Mo), and titanium (Ti), or a compound or mixture (e.g., a mixture of Ag and Mg) thereof. The second electrode EL2 may have a multi-layered structure including a reflective film or transflective film made of at least one of Ag, Mg, Cu, Al, Pt, Pd, Au, Ni, Nd, Ir, Cr, Li, Ca, LiF/Ca, LiF/Al, Mo, and Ti, or a compound or mixture thereof, and a transparent conductive layer formed of, for instance, at least one of indium tin oxide (ITO), indium zinc oxide (IZO), zinc oxide (ZnO), and indium tin zinc oxide (ITZO).

Although not illustrated, the second electrode EL2 may be connected to an auxiliary electrode. The auxiliary electrode may be disposed to face the light emitting layer EML and may include a film formed by depositing at least one of Ag, Mg, Cu, Al, Pt, Pd, Au, Ni, Nd, Ir, Cr, Li, Ca, LiF/Ca, LiF/Al, Mo, and Ti, or a compound or mixture thereof, and a transparent metal oxide disposed on the film, e.g., at least one of indium tin oxide (ITO), indium zinc oxide (IZO), zinc oxide (ZnO), and indium tin zinc oxide (ITZO).

When the organic electroluminescent device OEL is a front (or top) light emitting type organic light emitting device, the first electrode EL1 may be a reflective electrode, and the second electrode EL2 may be a transmissive electrode or transflective electrode. When the organic electroluminescent device OEL is a rear (or bottom) light emitting type organic light emitting device, the first electrode EL1 may be a transmissive electrode or transflective electrode, and the second electrode EL2 may be a reflective electrode.

The organic electroluminescent device OEL can emit light based on voltages applied to the first electrode EL1 and the second electrode EL2. For instance, when voltage is applied to each of the first electrode EL1 and the second electrode EL2, holes injected from the first electrode EL1 may move to the light emitting layer EML via the hole transport region HTR, and electrons injected from the second electrode EL2 may move to the light emitting layer EML via the electron transport region ETR. The electrons and the holes may be recombined with each other in the light emitting with EML to generate excitons. The excitons may drop from an excited state to a ground state to emit light.

In the display apparatus DD according to one or more exemplary embodiments described in association with FIG. 2, the display panel DP may include the circuit layer CL, and the circuit layer CL may include the conductive pattern layer CP or CP' that is described with reference to FIGS. 4A to 4C, 5A to 5C, 6, and/or 7. That is, the circuit layer CL may be provided with the conductive pattern layer CP or CP' including the protrusions EP or EP' and the holes HP or HP' to improve the flexibility of the display apparatus DD.

Also, in the descriptions with reference to FIGS. 8 to 10, the gate lines GL, the data lines DL, the driving voltage lines DVL, the switching thin film transistor TFT1, the driving thin film transistor TFT2, the capacitor Cst, the first semiconductor pattern SM1, the second semiconductor pattern SM2, the organic layer OL, the first electrode EL1, and the second electrode EL2 may correspond to the circuit layer CL in the cross-sectional view of the display apparatus DD as described with reference to FIG. 2.

In FIGS. 8 to 10, at least one of the gate lines GL, the data lines DL, the driving voltage lines DVL, the switching thin film transistor TFT1, the driving thin film transistor TFT2, the capacitor Cst, the first semiconductor pattern SM1, the second semiconductor pattern SM2, the first electrode EL1, and the second electrode EL2 may include the conductive pattern layer CP or CP' described with reference to FIGS. 4A to 4C, 5A to 5C, 6, and/or 7. The driving thin film transistor TFT2 may include a second gate electrode GE2, a second source electrode SE2, and a second drain electrode DE2. The capacitor Cst may include a first common electrode CE1 and a second common electrode CE2.

Figure 11A:
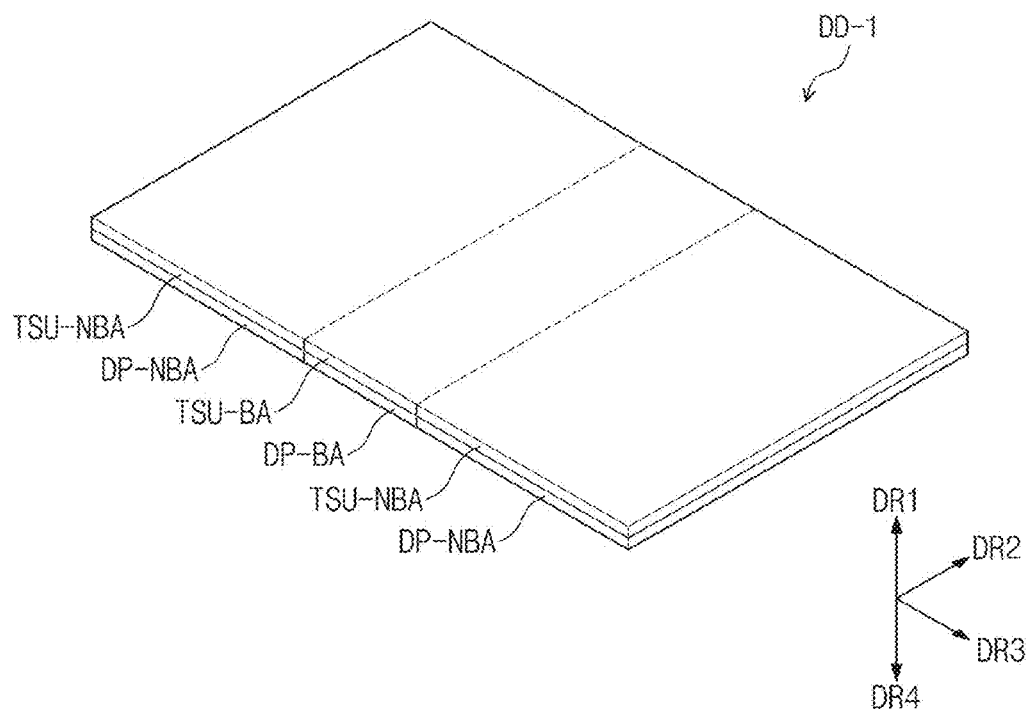
FIG. 11A is a perspective view illustrating a first state of the display apparatus of FIG. 1 according to one or more exemplary embodiments.
Figure 11B:
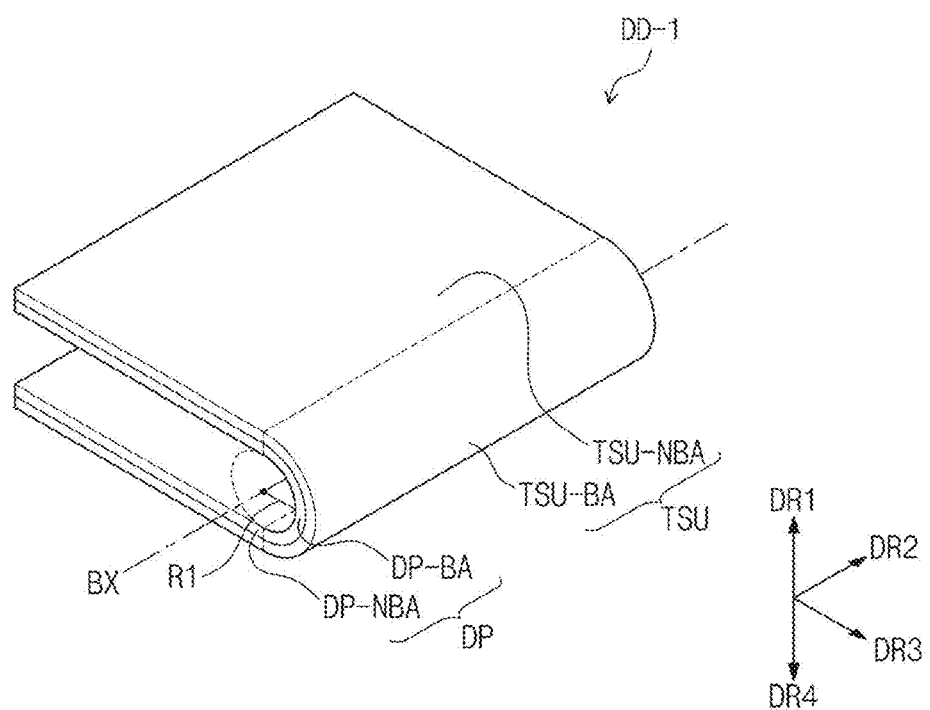
FIG. 11B is a perspective view illustrating a second state of the display apparatus of FIG. 1 according to one or more exemplary embodiments.

FIGS. 11A and 11B are perspective views of a display apparatus in various states according to various exemplary embodiments. In the description of the display apparatus DD-1 with reference to FIGS. 11A and 11B, contents duplicated with those previously described with reference to FIGS. 1 to 3, 4A to 4C, 5A to 5C, 6 to 10 will be omitted, and thus, primarily differences will be described to avoid obscuring exemplary embodiments.

The display apparatus DD-1 may be a flexible display apparatus. Although a foldable display apparatus is illustrated in FIGS. 11A and 11B as an example of the flexible display apparatus, exemplary embodiments are not limited thereto or thereby. For example, the display apparatus DD-1 may be a rollable display apparatus or a display apparatus of which a portion is bent. In this specification, the "bending" may mean that the display panel DP and the sensor unit TSU are bent in a determined shape by external force.

Referring to FIGS. 11A and 11B, the display apparatus DD-1 may be a foldable display apparatus that is bent with respect to a bending axis BX. The display apparatus DD-1 includes a display panel DP and a sensor unit TSU. The display panel DP may include a display bending part DP-BA and a display non-bending part DP-NBA. The sensor unit TSU may include a touch bending part TSU-BA and a touch non-bending part TSU-NBA. The display non-bending part DP-NBA is connected to (or extends from) the display bending part DP-BA. The touch non-bending part TSU-NBA is connected to (or extends from) the touch bending part TSU-BA. In FIGS. 11A and 11B, the display non-bending parts DP-NBA are disposed with the display bending part DP-BA therebetween, and the touch non-bending parts TSU-NBA are disposed with the touch bending part TSU-BA therebetween. However, exemplary embodiments are not limited thereto or thereby. For example, the display non-bending part DP-NBA and the touch non-bending part TSU-NBA may be disposed on only sides of the display bending part DP-BA and the touch bending part TSU-BA, respectively.

The display apparatus DD-1 may be bent in one direction with respect to the bending axis BX in a first mode (or state) and may be unbent (or unfolded) in a second mode (or state). In the first and second modes, each of the display non-bending part DP-NBA and the touch non-bending part TSU-NBA may be a portion that is not bent. Also, each of the display bending part DP-BA and the touch bending part TSU-BA may be a portion that is bent in the first mode and unbent in the second mode.

FIG. 11A illustrates the display apparatus DD-1 in an unfolded state, and FIG. 11B illustrates the display apparatus DD-1 in a folded state. That is, FIG. 11B illustrates the display apparatus DD-1 in the first mode, and FIG. 11B illustrates the display apparatus DD-1 in the second mode. Referring to FIG. 11B, the display panel DP and the sensor unit TSU of the display apparatus DD-1 may be bent with respect to the bending axis BX extending in the second direction DR2.

Although, when the display apparatus DD-1 is bent with respect to the bending axis BX, each of a distance between the bent portions facing each other of the sensor unit TSU and a distance between the bent portions facing each other of the display panel DP is uniform in FIG. 11B, exemplary embodiments are not limited thereto or thereby. For example, each of the distance between the bent portions facing each other of the sensor unit TSU and the distance between the bent portions facing each other of the display panel DP may not be uniform.

Also, when the display apparatus DD-1 is bent with respect to the bending axis BX, a case in which the distance between the touch non-bending parts TSU-NBA of the sensor unit TSU, which are bent to face each other, is greater than the distance the display non-bending parts BP-NBA of the display panel DP, which face each other, is illustrated in FIG. 11B. In other words, the display panel DP may be disposed closer to the bending axis BX than the sensor unit TSU. It is contemplated, however, that exemplary embodiments are not limited thereto or thereby. For example, the display apparatus DD-1 may be bent so that the distance between the display non-bending parts DP-NBA that are bent to face each other is greater than the distance between the touch non-bending parts TSU-NBA that are bent to face each other. In other words, the sensor unit TSU may be disposed closer to the bending axis BX than the display panel DP.

In FIG. 11B, one surface of the display bending part DP-BA may have a first radius of curvature R1. The first radius of curvature R1 may be, for example, about 1 mm to about 10 mm, e.g., about 2 mm to about 7 mm, for instance, 3 mm.

The display apparatus DD-1 of FIGS. 11A and 11B, according to one or more exemplary embodiments, may include the sensor unit TSU described with reference to FIG. 3. In the display apparatus DD-1 of FIGS. 11A and 11B, the sensor unit TSU may include the sensing electrode TE and the connection line TL, which include the conductive pattern layer CP or CP' described with reference to FIGS. 4A to 4C, 5A to 5C, 6, and/or 7.

In one or more exemplary embodiments, at least one of the sensing electrode TE or the connection line TL of the sensor unit TSU may be the conductive pattern layer CP or CP' including the base part BP or BP', the protrusions EP or EP', and the holes HP or HP'. At least one of the sensing electrode TE and the connection line TL may further include the first transparent conductive layer OE1 and the second transparent conductive layer OE2 disposed on at least one surface of the top and bottom surfaces of the conductive pattern layer CP or CP'. Also, the conductive pattern layer CP or CP' of the sensor unit TSU of FIGS. 11A and 11B may be disposed on the touch bending part TSU-BA.

In the display apparatus DD-1 of FIGS. 11A and 11B, the conductive pattern layer CP or CP' may include the base part BP or BP', the protrusions EP or EP' protruding from the base part BP or BP', and the holes HP or HP' recessed with respect to the base part BP or BP' to improve the flexibility of the sensing electrode TE and/or the connection line TL including the conductive pattern layer CP or CP'. That is, since the conductive pattern layer CP or CP' of the display apparatus DD-1 has flexibility even in the bent state as illustrated in FIG. 11B, an occurrence of cracks in the sensing electrode TE and/or the connection line TL may be prevented or at least reduced. Also, even though the bent state and the unfolded state are repeated, the sensing electrode TE and/or the connection line TL may not be deteriorated in electrical characteristics due to the conductive pattern layer CP or CP' having the flexibility.

Figure 12:
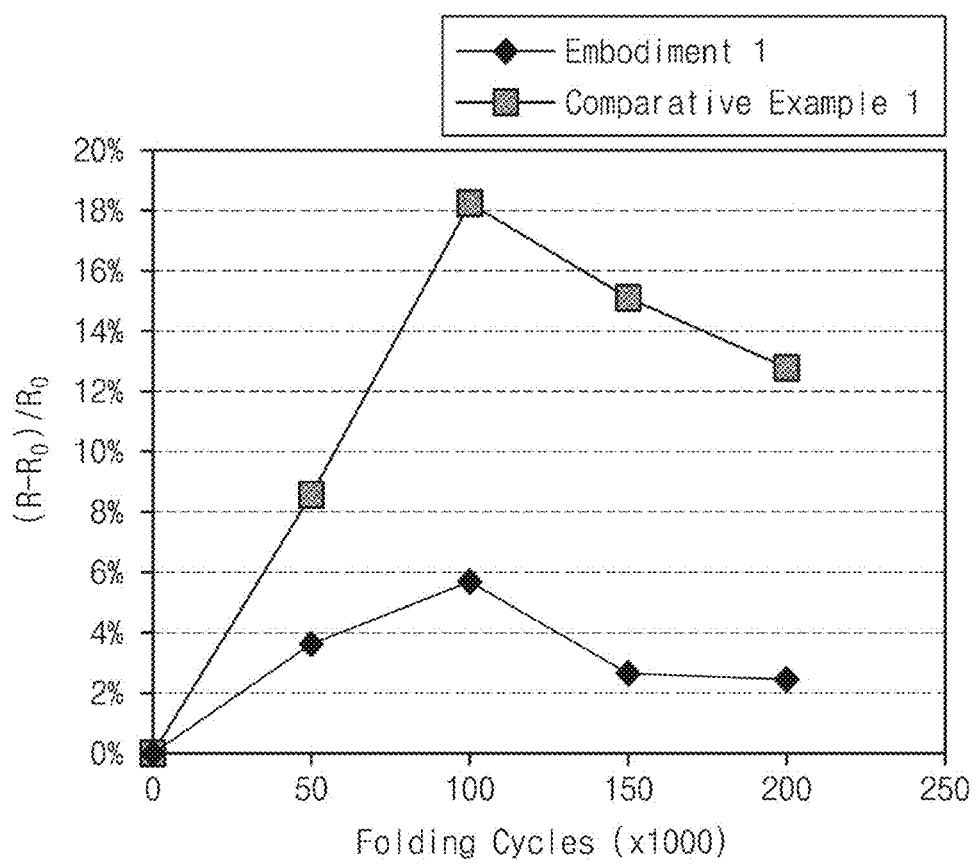
FIGS. 12 and 13 are graphs illustrating results of flexibility evaluations of at least one display apparatus including exemplary conductive pattern layers according to one or more exemplary embodiments.
Figure 13:
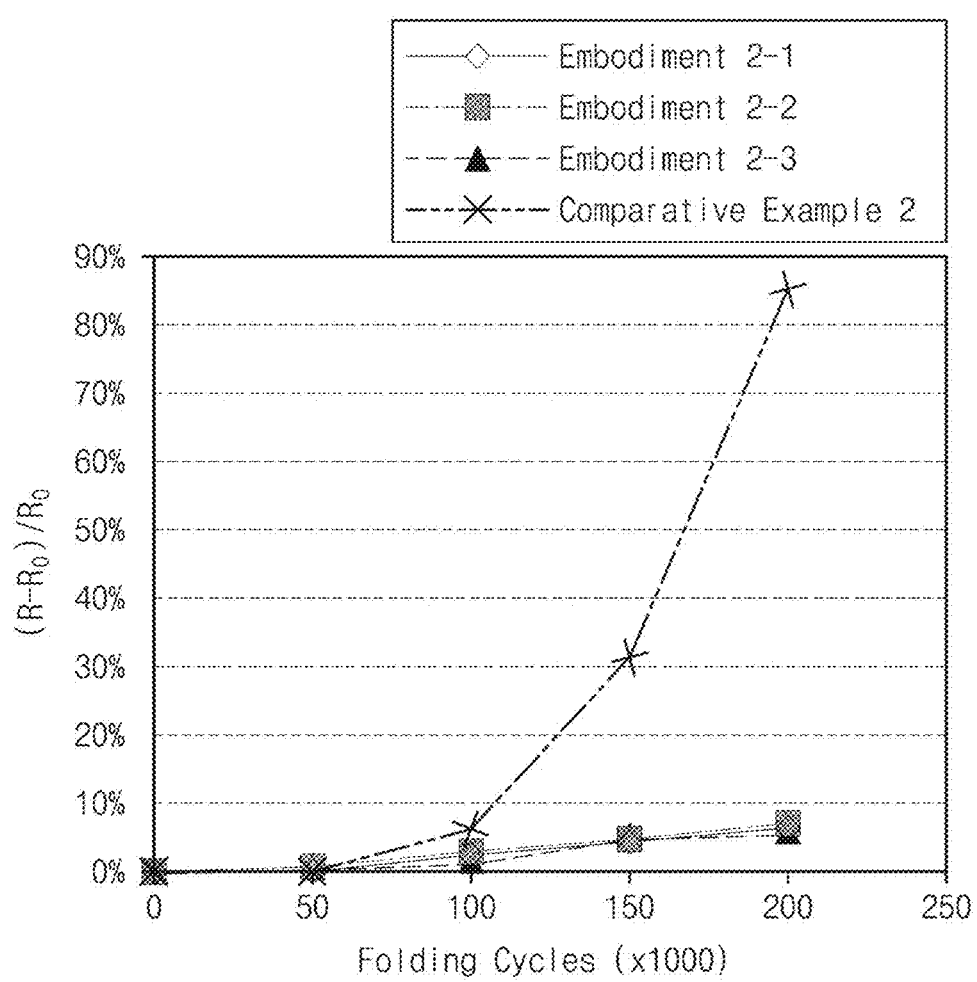

FIGS. 12 and 13 are graphs illustrating results of flexibility evaluations of at least one display apparatus including exemplary conductive pattern layers according to one or more exemplary embodiments. The evaluation results of FIGS. 12 and 13 were obtained by evaluating the flexibility of a corresponding conductive pattern layer in a respective display apparatus according to one or more exemplary embodiments. For descriptive and illustrative convenience, reference will be made to the features of display apparatus DD and conductive pattern layer CP.

For example, FIGS. 12 and 13 illustrate a ratio in variation of resistance according to a number of folding cycles using a graph that shows results obtained by testing the flexibility of the conductive pattern layer CP. In the graphs of FIGS. 12 and 13, an X-axis represents a folding number (or cycle), and a Y-axis represents a ratio in variation of resistance of a corresponding conductive pattern layer CP. In the values shown in the Y-axis, $R_0$ represents an initial resistance value, and R represents a resistance value after the folding test. In FIGS. 12 and 13, the conductive pattern layers CP were formed using an alloy material of Ag and In with In being contained in about 0.4 percentage by weight (wt %) with respect to Ag.

FIG. 12 is a graph of results obtained by testing flexibility of conductive pattern layers CP. Embodiment 1 of FIG. 12 is a graph of results obtained by performing a folding test when the conductive pattern layer CP is formed on a polyimide substrate SUB. Comparative Example 1 is a graph of results obtained by performing a folding test when the Ag/In alloy material is deposited as one layer on the polyimide substrate SUB. Table 1 shows results of preparation conditions of a sample and a ratio in variation of the resistance value according to Comparative Example 1 and Embodiment 1. In Table 1, a thickness of the conductive pattern layer CP according to Embodiment 1 represents a mean thickness of the base part BP of the conductive pattern layer CP. The initial resistance value represents a resistance value before initiation of the folding test.

TABLE 1

| | Thickness (Å) of Conductive Pattern Layer | Initial Resistance Value ($\Omega/cm^2$) | Ratio in Variation of Resistance Value $(R - R_0)/R_0$ (%) according to Number of Folding Cycles | | | |
|---|---|---|---|---|---|---|
| | | | 50,000 | 100,000 | 150,000 | 200,000 |
| Embodiment 1 | 150 | 5.29 | 3.59 | 5.67 | 2.65 | 2.46 |
| Comparative Example 1 | 150 | 4.79 | 8.59 | 18.23 | 15.10 | 12.76 |

Referring to Table 1 and the graph of FIG. 12, although the number of folding cycles in Embodiment 1 increases, an increasing ratio of the resistance value was maintained to about 10% or less. On the other hand, in case of Comparative Example 1, the increasing ratio of the resistance value was maintained to about 10% or less with the number of folding cycles being less than about 50,000 times. That is, in case of the sensing electrode TE or connection line TL including the conductive pattern layer CP having the nanostructure, although the number of folding cycles increases, the resistance value does not substantially increase. Thus, it is seen that electrical characteristics of the sensing electrode TE or the connection line TL are maintained even though tensile force is applied to the conductive pattern layer CP, like in the folding test.

In FIG. 13, Embodiments 2-1, 2-2, and 2-3 are embodiments for testing the flexibility of the conductive pattern layer CP when the first transparent conductive layer OE1 and the second transparent conductive layer OE2 are disposed on respective lower and upper surfaces of the conductive pattern layer CP. In the embodiments, the base substrate SUB is made of polyimide, the conductive pattern layer CP is disposed on the polyimide substrate SUB, and the first transparent conductive layer OE1 and the second transparent conductive layer OE2 are respectively disposed on the lower and upper surfaces of the conductive pattern layer CP. Also, in each of Embodiments 2-1, 2-2, and 2-3, the conductive pattern layer CP may be made of an alloy of Ag/In, and each of the first transparent conductive layer OE1 and the second transparent conductive layer OE2 may be an ITO layer. Each of the first transparent conductive layer OE1 and the second transparent conductive layer OE2 had a thickness of about 70 Å. Also, the first transparent conductive layer OE1, the conductive pattern layer CP, and the second transparent conductive layer OE2 were successively formed on the polyimide substrate SUB. In Comparative Example 2, one layer formed of Ag/In alloy was used in place of the conductive pattern layer CP of the embodiment. The Ag/In alloy layer of Comparative Example 2 does not include protrusions and holes.

In Table 2, a thickness of the conductive pattern layer CP represents a mean thickness of the base parts BP of the conductive pattern layers CP. The initial resistance value represents a resistance value before initiation of the folding test.

TABLE 2

| | Thickness (Å) of Conductive Pattern Layer | Initial Resistance Value (Ω/cm²) | Ratio in Variation of Resistance Value $(R - R_0)/R_0$ (%) according to Number of Folding Cycles | | | |
|---|---|---|---|---|---|---|
| | | | 50,000 | 100,000 | 150,000 | 200,000 |
| Embodiment 2-1 | 100 | 23.4 | 0.18 | 2.43 | 4.49 | 6.01 |
| Embodiment 2-2 | 150 | 8.81 | 0.48 | 2.88 | 4.63 | 7.03 |
| Embodiment 2-3 | 200 | 3.99 | 0.85 | 1.41 | 5.07 | 5.92 |
| Comparative Example 2 | 150 | 4.46 | 0 | 6.06 | 31.30 | 85.10 |

Referring to the results of Table 2 and the graph of FIG. 13, even though the first transparent conductive layer OE1 disposed on the bottom surface of the conductive pattern layer CP and the second transparent conductive layer OE2 disposed on the upper surface of the conductive pattern layer CP are provided, it is seen that the flexibility of the conductive pattern layer CP according to Embodiments 2-1, 2-2, and 2-3 is superior to that of the conductive pattern layer CP according to Comparative Example 2. In case of Embodiments 2-1, 2-2, and 2-3, although the number of folding cycles increases, an increasing ratio of the resistance value was maintained to about 10% or less. On the other hand, in case of Comparative Example 2, the increasing ratio of the resistance value was maintained to about 10% or less with the number of folding cycles being less than about 100,000 times. That is, in case of the sensing electrode TE and/or connection line TL including the conductive pattern layer CP having the nanostructure and additionally including the first transparent conductive layer OE1 and the second transparent conductive layer OE2, although the number of folding cycles increases, the resistance value does not substantially increase. Thus, it is seen that electrical characteristics of the sensing electrode TE and/or the connection line TL are maintained even though tensile force is applied to the conductive pattern layer CP and the first transparent conductive layer OE1 and the second transparent conductive layer OE2, like in association with the folding test.

Figure 14A:
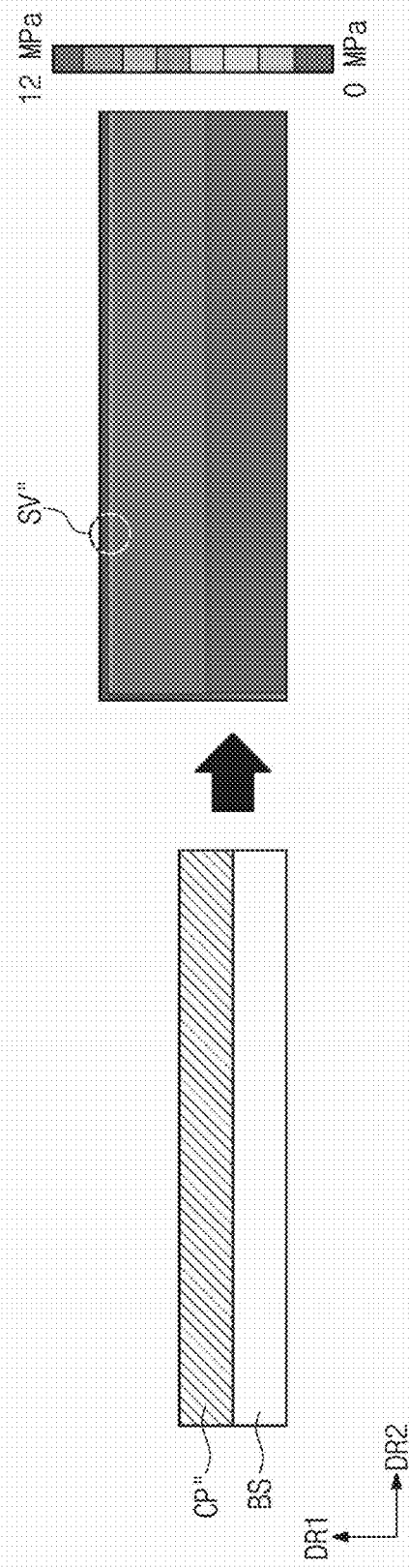
FIGS. 14A, 14B, and 14C are views illustrating simulation results evaluating the flexibility of conductive pattern layers of at least one display apparatus according to one or more exemplary embodiments.
Figure 14B:
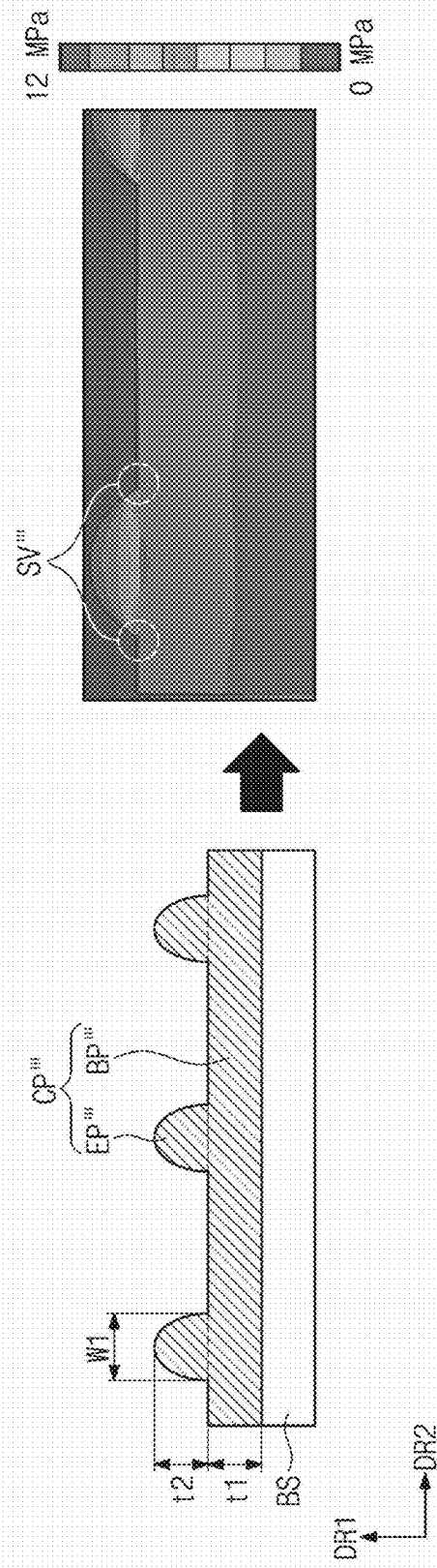
Figure 14C:
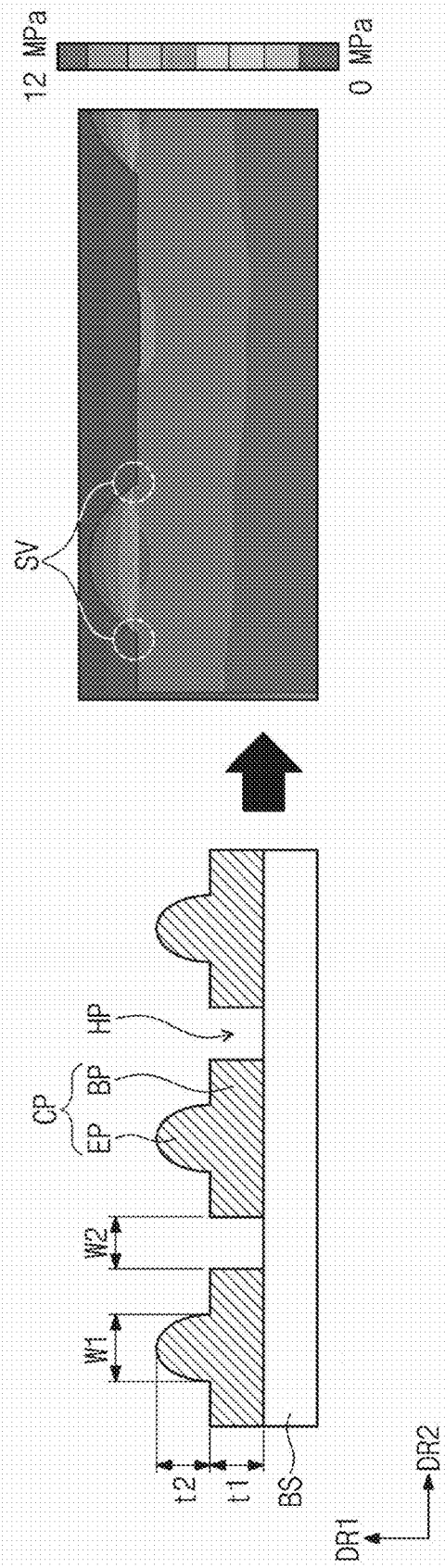

FIGS. 14A, 14B, and 14C are views illustrating simulation results evaluating the flexibility of conductive pattern layers of at least one display apparatus according to one or more exemplary embodiments. The simulation results were obtained via computer-aided engineering analysis by simulating tensile stress applied to a corresponding conductive pattern layer according to a structure of the corresponding conductive pattern layer.

FIG. 14A is a view illustrating distribution of a stress value when a conductive pattern layer CP'' made of Ag is formed on a substrate BS. FIG. 14B is a view illustrating distribution of a stress value when a conductive pattern layer CP''' disposed on the substrate BS includes only a base part BP''' and protrusions EP''' disposed on the base part BP'''. FIG. 14C is a view illustrating distribution of a stress value when a conductive pattern layer CP including a base part BP, protrusions EP disposed on the base part BP, and holes HP in the base part BP is formed on the substrate BS, like the conductive patter layer CP or CP' provided in the display apparatus DD according to one or more exemplary embodiments.

In FIGS. 14A to 14C, the substrate BS on which the conductive pattern layer CP, CP'', or CP''' is formed was a plastic substrate formed of polyimide. Also, the polyimide substrate had a thickness of about 10 µm.

In FIG. 14A, the conductive pattern layer CP'' has a thickness of about 150 Å. In the conductive pattern layer CP''' of FIG. 14B, the base part BP''' has a thickness t1 of about 100 Å, and each of the protrusions EP''' has a maximum height t2 of about 1,600 Å with respect to the base part BP''' and a maximum width W1 of about 5,000 Å. In the conductive pattern layer CP of FIG. 14C, the base part BP has a thickness t1 of about 100 Å, each of the protrusions EP has a maximum height t2 of about 1,600 Å with respect to the base part BP and a maximum width W1 of about 5,000 Å, and each of the holes HP has a maximum width W2 of about 2,500 Å.

FIGS. 14A to 14C illustrate that the distribution of the stress value when the conductive pattern layer CP, CP'', or CP''' is folded so that the tensile force is applied to the conductive pattern layer CP, CP'', or CP''', i.e., so that the conductive pattern layer CP, CP'', or CP''' is exposed to the outside, for example, when the conductive pattern layer CP, CP'', or CP''' is folded as illustrated in FIG. 11B.

In FIG. 14A, a portion SV'' at which the maximum stress value is uniform within the conductive pattern layer CP'' formed as one layer. That is, it is seen that the tension stress is applied to the entire conductive pattern layer CP'' when the conductive pattern layer CP'' is formed as one layer without having a separate nanostructure. In FIG. 14A, the stress value at the portion SV'' having the maximum stress value may be about 11 MPa.

In FIG. 14B, the conductive patter layer CP''' has a maximum stress value at a portion SV''' on the base part BP''' between the protrusions EP'''. That is, since the maximum stress value is generated between the protrusions EP''' in case of the conductive pattern CP''' including only the protrusions EP''' as illustrated in FIG. 14B, cracks may propagate between the protrusions EP'''. However, since the stress is not transmitted to the inside of the protrusions EP''' in FIG. 14B, it is seen that each of the protrusions EP''' can function as a dam that blocks or reduces the propagation of the cracks.

In FIG. 14C, a portion SV having the maximum stress value corresponds to an edge portion of each of the protrusions EP. However, when compared to the case of FIG. 14B, the portion SV having the maximum stress value was not diffused between the protrusions EP, and the stress around the holes HP was reduced. That is, the holes HP of the conductive pattern layer CP may reduce the stress between the protrusions EP to prevent (or reduce) the cracks from being transmitted within the conductive pattern layer CP.

That is, referring to the results illustrated in FIGS. 14A to 14C, the conductive pattern layer CP may include the holes HP and the protrusions EP to reduce the stress when the folding is performed. The conductive pattern layer CP may have the nanostructure including the protrusions EP and the holes HP to improve flexibility. Thus, in case of a display apparatus including the conductive pattern layer CP having the nanostructure as illustrated in FIG. 14C, even though the display apparatus is bent, i.e., stress is applied, the stress may be reduced at the protrusions EP and the holes HP to prevent or reduce the cracks from being transmitted, thereby improving lifespan and quality of the display apparatus against the stress.

According to one or more exemplary embodiments, a display apparatus may include a conductive pattern layer including protrusions and holes to secure flexibility of a sensing electrode and/or a connection line. That is, although the display apparatus is bent in a direction or repeatedly bent in a direction and an opposite direction, possibility of an occurrence of cracks or short-circuit in the conductive patter layer may be significantly reduced to improve mechanical and/or electrical properties of the conductive pattern layer. In one or more exemplary embodiments, a display apparatus may include a conductive pattern layer having the determined nanostructure including a plurality of protrusions and a plurality of holes to realize improved flexibility.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display apparatus comprising:
a display panel; and
a sensor structure disposed on the display panel,
wherein the sensor structure comprises a sensing electrode and a connection line connected to the sensing electrode, at least one of the sensing electrode and the connection line comprising a conductive pattern layer, and
wherein the conductive pattern layer comprises:
a base layer comprising a first surface facing the display panel;
protrusions randomly protruding from a second surface of the base layer, the second surface opposing the first surface; and
holes randomly defined in the second surface of the base layer.

2. The display apparatus of claim 1, wherein the conductive pattern layer comprises silver (Ag) or an Ag alloy.

3. The display apparatus of claim 2, wherein the Ag alloy comprises at least one of indium (In), zinc (Zn), gold (Au), nickel (Ni), cobalt (Co), copper (Cu), bismuth (Bi), antimony (Sb), and aluminum (Al).

4. The display apparatus of claim 2, wherein an X-ray diffraction intensity of a (111) orientation crystal plane of the Ag or the Ag alloy is at least 3 times greater than an X-ray diffraction intensity of a (220) orientation crystal plane of the Ag or the Ag alloy.

5. The display apparatus of claim 1, wherein at least one of the sensing electrode and the connection line further comprises at least one transparent conductive layer, the at least one transparent conductive layer being disposed on at least one of a top surface of the conductive pattern layer and a bottom surface of the conductive pattern layer.

6. The display apparatus of claim 5, wherein the transparent conductive layer comprises at least one of indium tin oxide (ITO), indium zinc oxide (IZO), zinc oxide (ZnO), and indium tin zinc oxide (ITZO).

7. The display apparatus of claim 1, wherein a thickness of the base layer is from 60 Å to 460Å.

8. The display apparatus of claim 1, wherein a distribution density of the protrusions is from 0.3 protrusions/$\mu m^2$ to 10 protrusions/$\mu m^2$.

9. The display apparatus of claim 1, wherein a distribution density of the holes is from 5 holes/$\mu m^2$ to 100 holes/$\mu m^2$.

10. The display apparatus of claim 1, wherein a mean size of the protrusions is from 10 nm to 1,000 nm.

11. The display apparatus of claim 1, wherein a mean size of the holes is from 2 nm to 3,000 nm.

12. The display apparatus of claim 1, wherein:
the display panel comprises:
a base substrate; and
a circuit layer disposed on the base substrate, the circuit layer comprising electrodes and conductive lines; and
at least one of the electrodes and the conductive lines comprises the conductive pattern layer.

13. The display apparatus of claim 12, wherein:
the circuit layer comprises a gate line, a data line, a driving voltage line, a thin film transistor, a semiconductor pattern, and a capacitor; and
at least one of the gate line, the data line, the driving voltage line, the thin film transistor, the semiconductor pattern, and the capacitor comprises the conductive pattern layer.

14. The display apparatus of claim 1, wherein:
the display panel comprises:
a display bending part; and
a display non-bending part adjacent to the display bending part; and
the sensor structure comprises:
a touch bending part overlapping the display bending part; and
a touch non-bending part overlapping the display non-bending part.

15. The display apparatus of claim 14, wherein the touch bending part comprises the conductive pattern layer.

16. The display apparatus of claim 14, wherein:
in a first operational state, the display panel and the sensor structure are bent with respect to a bending axis; and
in a second operational state the display panel and the sensor structure are unfolded.

17. The display apparatus of claim 16, wherein the first operational state comprises:
a first bending mode in which the display panel and the sensor structure are bent in a first direction with respect to the bending axis; and
a second bending mode in which the display panel and the sensor structure are bent in a second direction opposite the first direction with respect to the bending axis.

18. The display apparatus of claim 1, wherein some of the holes extend from the second surface to the first surface.

19. A display apparatus comprising:
a display panel; and
a sensor structure disposed on the display panel,
wherein the sensor structure comprises a sensing electrode and a connection line connected to the sensing electrode, at least one of the sensing electrode and the connection line comprising a conductive pattern layer, and
wherein the conductive pattern layer comprises:
a base layer;
protrusions randomly disposed on the base layer, the protrusions protruding from the base layer; and
holes randomly defined in the base layer, and
wherein a distribution density of the protrusions is from 0.3 protrusions/$\mu m^2$ to 10 protrusions/$\mu m^2$.

20. A display apparatus comprising:
a display panel; and
a sensor structure disposed on the display panel, wherein the sensor structure comprises a sensing electrode and a connection line connected to the sensing electrode, at least one of the sensing electrode and the connection line comprising a conductive pattern layer, and wherein the conductive pattern layer comprises:
  a base layer;
  protrusions randomly disposed on the base layer, the protrusions protruding from the base layer; and
  holes randomly defined in the base layer, and wherein a distribution density of the holes is from 5 holes/$\mu m^2$ to 100 holes/$\mu m^2$.

* * * * *